(12) United States Patent  
Syed

(10) Patent No.: US 8,193,448 B2
(45) Date of Patent: Jun. 5, 2012

(54) SYSTEMS AND METHODS OF MANAGING CABLES

(75) Inventor: Farrukh Shahzad Syed, O'Fallon, MO (US)

(73) Assignee: American Power Conversion Corporation, West Kingston, RI (US)

( * ) Notice: Subject to any disclaimer, the term of this patent is extended or adjusted under 35 U.S.C. 154(b) by 314 days.

(21) Appl. No.: 12/608,240

(22) Filed: Oct. 29, 2009

(65) Prior Publication Data

US 2011/0100668 A1    May 5, 2011

(51) Int. Cl.
*H02G 3/04* (2006.01)

(52) U.S. Cl. ............. 174/68.1; 174/68.3; 174/99 R; 174/72 A; 248/49; 248/68.1

(58) Field of Classification Search ............. 174/50, 174/68.1, 68.3, 72 A, 95, 97, 99 R, 481, 480, 174/484, 494, 503; 248/49, 68.1; 385/134, 385/135; 211/216, 162

See application file for complete search history.

(56) References Cited

U.S. PATENT DOCUMENTS

| | | | | |
|---|---|---|---|---|
| 3,968,322 A * | 7/1976 | Taylor | ............. | 174/72 A |
| 4,432,519 A * | 2/1984 | Wright | ............. | 174/72 A |
| 5,580,014 A * | 12/1996 | Rinderer | ............. | 174/68.1 |
| 5,639,048 A * | 6/1997 | Bartholomew et al. | ............. | 248/49 |
| 6,252,171 B1 * | 6/2001 | Barr | ............. | 174/95 |
| 6,313,405 B1 * | 11/2001 | Rinderer | ............. | 174/68.3 |
| 6,365,830 B1 * | 4/2002 | Snider et al. | ............. | 174/484 |
| 6,437,243 B1 * | 8/2002 | VanderVelde et al. | ............. | 174/68.3 |
| 6,590,785 B1 | 7/2003 | Lima et al. | | |
| 6,776,707 B2 | 8/2004 | Koplin | | |
| 6,967,283 B2 | 11/2005 | Rasmussen et al. | | |
| 6,992,247 B2 * | 1/2006 | Rasmussen et al. | ............. | 174/494 |
| 7,172,077 B2 | 2/2007 | Mendoza | | |
| 7,259,963 B2 | 8/2007 | Germagian et al. | | |
| 7,293,666 B2 | 11/2007 | Mattlin et al. | | |
| 7,403,391 B2 | 7/2008 | Germagian et al. | | |
| 7,425,682 B2 * | 9/2008 | Rasmussen et al. | ............. | 174/68.1 |
| 7,488,202 B2 | 2/2009 | Spitaels et al. | | |

(Continued)

FOREIGN PATENT DOCUMENTS

DE        19841643 A1        3/2000

(Continued)

OTHER PUBLICATIONS

International Search Report for PCT/US2010/050820 mailed Dec. 17, 2010.

(Continued)

*Primary Examiner* — Angel R Estrada
(74) *Attorney, Agent, or Firm* — Lando & Anastasi, LLP

(57) ABSTRACT

A cable trough includes a tray having a tray portion extending along a generally horizontal plane with two opposite side edges, a first side wall portion extending along one side edge of the tray portion on a plane generally perpendicular to the plane of the tray portion, and a second side wall portion extending along the other side edge of the tray portion on a plane generally perpendicular to the plane of the tray portion. The cable trough further includes a first side wall having at least one first attachment configuration constructed and arranged to secure the first side wall to the first side wall portion of the tray, and a second side wall having at least one second attachment configuration constructed and arranged to secure the second side wall to the second side wall portion of the tray. Various cable trough systems and methods are further disclosed.

16 Claims, 35 Drawing Sheets

U.S. PATENT DOCUMENTS

| | | |
|---|---|---|
| 7,682,187 B2 | 3/2010 | Spitaels et al. |
| 7,763,800 B2 * | 7/2010 | Lesniak et al. ............... 174/68.3 |
| 7,922,012 B2 * | 4/2011 | Sisley ............................. 211/26 |
| 2001/0022231 A1 | 9/2001 | Dyer |
| 2005/0040295 A1 | 2/2005 | Sinkoff |
| 2007/0167125 A1 | 7/2007 | Rasmussen et al. |
| 2008/0041077 A1 | 2/2008 | Tutunoglu |
| 2008/0205028 A1 | 8/2008 | Papakos et al. |
| 2010/0193238 A1 | 8/2010 | Duffy |

FOREIGN PATENT DOCUMENTS

| | | |
|---|---|---|
| EP | 1249653 A1 | 10/2002 |
| GB | 1580213 A | 11/1980 |

OTHER PUBLICATIONS

Neil Rasmussen, "A Scalable, Reconfigurable, and Efficient Data Center Power Distribution Architecture," White Paper #129, APC by Schneider Electric, 2009 American Power Conversion, pp. 1-18.

* cited by examiner

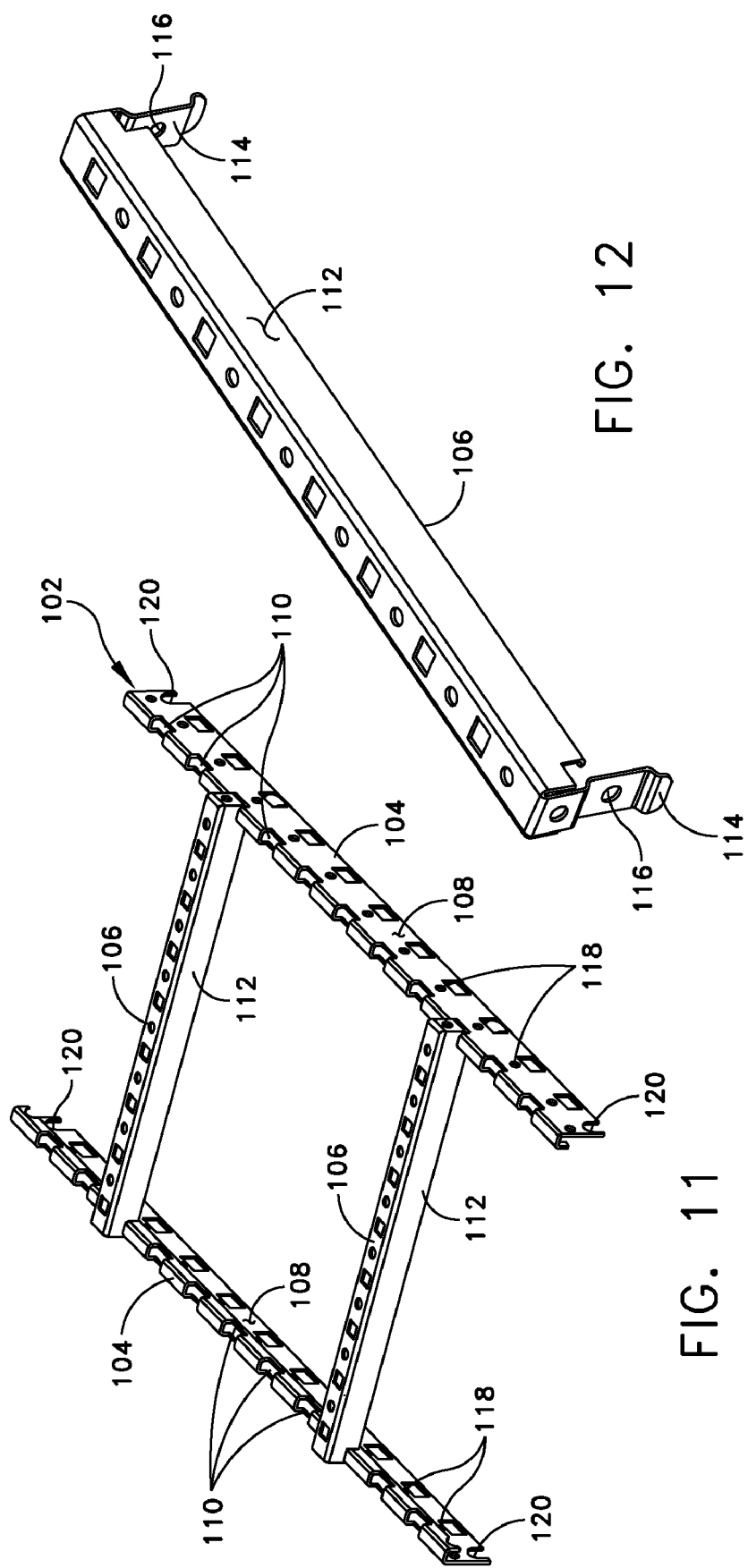

SYSTEMS AND METHODS OF MANAGING CABLES

BACKGROUND OF THE DISCLOSURE

1. Field of the Disclosure

The present disclosure relates generally to systems and methods for providing cable management within facilities used to house electronic equipment, and more specifically to cable troughs used to manage cables within equipment racks provided in data centers.

2. Discussion of Related Art

Centralized data centers for computer, communications and other electronic equipment have been in use for a number of years, and more recently, with the increasing use of the Internet, large scale data centers that provide hosting services for Internet Service Providers (ISPs), Application Service Providers (ASPs) and Internet content providers are become increasingly popular. Typical centralized data centers contain numerous racks of equipment that require power, cooling and connections to communications facilities. It is common in data centers to use raised flooring, beneath which power cables and communication cables may be run between racks of equipment and to facility distribution panels. In some facilities, in place of, or in addition to the use of raised flooring, overhead cable troughs and ladders are used to route cables throughout the facility. These cable troughs and ladders may be fastened on top of and between equipment racks arranged throughout the facility.

There are several drawbacks with the traditional design of data centers employing raised flooring. For example, raised flooring is expensive and cannot be easily accommodated in some facilities, such as those that do not have high ceilings. In addition, the routing of cables under raised floors often creates "rats nests" and it often becomes difficult, if not impossible, to locate particular cables beneath a raised floor. Further, when it is desired to add new equipment to a data center having a raised floor, it is often difficult to pull cables past existing cables under the floor, and the build up of cables beneath a floor often prevents cooling air from flowing beneath the floor to electronic equipment racks.

Cable distribution troughs and ladders, which run cables above the electronic equipment racks, may be used in place of or in addition to raised flooring. An example of routing cabling between equipment racks by using cable distribution troughs and ladders contained on the roofs of the racks is disclosed in U.S. Pat. No. 6,967,283. FIG. 1 illustrates a conventional cable trough, generally indicated at 10, which is capable of being mounted on the top or the cover of an equipment rack (not shown). The cable trough 10 shown in FIG. 1 is incapable of being adjusted and may only support a limited number of cables 12, e.g., thirty-five runs of fifty-amp power cables, each having a nominal diameter of 0.85 inches.

SUMMARY OF THE DISCLOSURE

One aspect of the present disclosure is directed to a cable trough comprising a tray including a tray portion extending along a generally horizontal plane and having two opposite side edges, a first side wall portion extending along one side edge of the tray portion on a plane generally perpendicular to the plane of the tray portion, and a second side wall portion extending along the other side edge of the tray portion on a plane generally perpendicular to the plane of the tray portion. The cable trough further comprises a first side wall including at least one first attachment configuration constructed and arranged to secure the first side wall to the first side wall portion of the tray, and a second side wall including at least one second attachment configuration constructed and arranged to secure the second side wall to the second side wall portion of the tray.

Embodiments of the cable trough may be directed to providing the first and second attachment configurations with a plurality of openings formed in respective first and second side walls along a height of the respective first and second side walls. Each of the first and second side wall portions may have at least one opening formed therein. The cable trough may further comprise at least one fastener to secure the tray to the first side wall and at least one fastener to secure the tray to the second side wall. The cable trough may further comprise an interconnecting member configured to secure a first cable trough to a second cable trough. In certain embodiments, the first and second side walls have upper and lower edges configured to enable a first cable trough to be stacked on top of a second cable trough. Upper corners of the side walls may have removed or removable portions formed therein. The tray portion and the first and second side walls may have removable portions. The cable trough may further comprise a top cover configured to enclose an open top of the tray, and at least one side cover configured to enclose a side of at least one of the first and second side walls. An insert may be configured to replace the tray to achieve an open bottom configuration of the cable trough. In one embodiment, the insert may include at least one longitudinal member and at least one cross member. The cable trough may further comprise a third side wall to create a longitudinal channel within the cable trough.

Another aspect of the disclosure is directed to a method of assembling a cable trough comprising: providing a tray including a tray portion extending along a generally horizontal plane and having two opposite side edges, a first side wall portion extending along one side edge of the tray portion on a plane generally perpendicular to the plane of the tray portion, and a second side wall portion extending along the other side edge of the tray portion on a plane generally perpendicular to the plane of the tray portion; securing a first side wall to the first side wall portion of the tray, the first side wall including at least one first attachment configuration having a plurality of openings formed therein to enable the first side wall to be secured to the first side wall portion of the tray at a desire elevation along a height of the first side wall; and securing a second side to the second side wall portion of the tray, the second side wall including at least one second attachment configuration having a plurality of openings formed therein to enable the second side wall to be secured to the second side wall portion of the tray at a desired elevation along a height of the second side wall.

Embodiments of the method may further include securing the respective side wall to the side wall portion with at least one fastener. The method may further comprise securing the assembled cable trough to a second cable trough. In one embodiment, the assembled cable trough is secured to the second cable trough by stacking the assembled cable trough on top of the second cable trough. In another embodiment, the assembled cable trough is secured to the second cable trough by positioning the assembled cable trough next to the second cable trough so that the tray of the assembled cable trough is disposed at the same elevation as the tray of the second cable trough. The method may further include securing a cover to at least one of a side or top of the assembled cable trough. The method may further include the tray with an insert configured to achieve an open bottom configuration of the cable trough.

Yet another aspect of the disclosure is directed to a cable trough comprising an insert, a first side wall including at least one first attachment configuration constructed and arranged to secure the first side wall to the insert, and a second side wall including at least one second attachment configuration constructed and arranged to secure the second side wall to the insert. The first and second attachment configurations are constructed and arranged to secure the insert at a selected elevation with respect to the first and second side walls.

Embodiments of the cable trough include configuring the insert to have at least one longitudinal member and at least one cross member. The first and second attachment configurations include a plurality of openings formed in respective first and second side walls. Each of the first and second side wall portions have at least one opening formed therein. The cable trough may further comprise at least one fastener to secure the tray to the first side wall and at least one fastener to secure the tray to the second side wall. The cable trough may further comprise an interconnecting member configured to secure a first cable trough to a second cable trough. The first and second side walls have upper and lower edges configured to enable a first cable trough to be stacked on top of a second cable trough. Upper corners of the side walls have removed or removable portions formed therein. The first and second side walls have removable portions. The cable trough may further comprise a top cover configured to enclose an open top of the cable trough, and at least one side cover configured to enclose a side of at least one of the first and second side walls. The cable trough may further comprise a second insert. In one embodiment, the first side wall includes at least one second attachment configuration constructed and arranged to secure the first side wall to the second insert. The second side wall includes at least one second attachment configuration constructed and arranged to secure the second side wall to the second insert. The first and second attachment configurations may be constructed and arranged to secure the insert at a selected elevation with respect to the first and second side walls.

A further aspect of the disclosure is directed to a cable trough assembly comprising a first cable trough including a tray including a tray portion extending along a generally horizontal plane and having two opposite side edges. A first side wall portion extends along one side edge of the tray portion on a plane generally perpendicular to the plane of the tray portion. A second side wall portion extends along the other side edge of the tray portion on a plane generally perpendicular to the plane of the tray portion. The cable trough assembly further comprises a first side wall including at least one first attachment configuration constructed and arranged to secure the first side wall to the first side wall portion of the tray, and a second side wall including at least one second attachment configuration constructed and arranged to secure the second side wall to the second side wall portion of the tray. The cable trough assembly further comprises a second cable trough including an insert, a third side wall including at least one third attachment configuration constructed and arranged to secure the third side wall to the insert, and a fourth side wall including at least one fourth attachment configuration constructed and arranged to secure the fourth side wall to the insert.

Embodiments of the cable trough assembly may include configuring the third and fourth attachment configurations of the second cable trough to secure the insert of the second cable trough at a selected elevation with respect to the third and fourth side walls. The insert of the second cable trough includes at least one longitudinal member and at least one cross member. The at least cross member of the insert of the second cable trough has a length greater than a width of the tray portion of the first cable trough. Each of the first and second side walls of the first cable trough has an end edge configured to be releasably secured to a respective end edge of the third and fourth side walls of the second edge.

Yet another aspect of the disclosure is directed to a cable trough assembly comprising a first cable trough including one of a tray and an insert, a first side wall constructed and arranged to secure the first side wall to the one of the tray and the insert, and a second side wall constructed and arranged to secure the second side wall to the one of the tray and the insert. The first cable trough further includes at least one first attachment configuration constructed and arranged to releasably secure the first cable trough to a first enclosure. The cable trough assembly further comprises a second cable trough including one of a second tray and a second insert, a third side wall constructed and arranged to secure the third side wall to one of the second tray and the second insert, and fourth side wall constructed and arranged to secure the fourth side wall to one of the second tray and the second insert. The second cable trough further includes at least one second attachment configuration constructed and arranged to releasably secure the second cable trough to a second enclosure.

Embodiments of the cable trough assembly are directed to providing the first cable trough with a tray including a first tray portion extending along a generally horizontal plane and having two opposite side edges, a first side wall portion extending along one side edge of the first tray portion on a plane generally perpendicular to the plane of the first tray portion, and a second side wall portion extending along the other side edge of the first tray portion on a plane generally perpendicular to the plane of the first tray portion. The first cable trough includes at least one first attachment configuration to secure the first side wall portion to the first side wall and at least one second attachment configuration to secure the second side wall portion to the second side wall. The second cable trough includes a second tray including a second tray portion extending along a generally horizontal plane and having two opposite side edges, a third side wall portion extending along one side edge of the second tray portion on a plane generally perpendicular to the plane of the second tray portion, and a fourth side wall portion extending along the other side edge of the second tray portion on a plane generally perpendicular to the plane of the second tray portion. The second cable trough includes at least one third attachment configuration to secure the third first side wall portion to the third side wall and at least one fourth attachment configuration to secure the fourth side wall portion to the fourth side wall. The first and second cable troughs are positioned next to one another so that an end of the first cable tray abuts an end of the second cable tray. The second cable trough includes a second insert having at least one longitudinal member and at least one cross member. The at least one cross member of the insert has a length greater than a width of the tray portion of the first cable trough. The first cable trough is positioned next to the second cable trough so that the first side wall of the first cable trough is disposed next to and along a plane parallel to the fourth side wall of the second cable trough. The second cable trough includes fifth and sixth side walls disposed inboard from the third and fourth side walls. The cable trough assembly may further comprise a bridge cable trough configured to be disposed between and secured to the first and second cable trough in a position in which the bridge cable trough extends over a third enclosure disposed between the first and second enclosures.

An additional aspect of the disclosure is directed to a cable trough assembly comprising a first cable trough configured to be releasably secured to a first enclosure, a second cable trough configured to be releasably secured to a second enclosure, and a bridge cable trough configured to be disposed between and secured to the first and second cable trough in a position in which the bridge cable trough extends over a third enclosure disposed between the first and second enclosures so that there is a space between the bridge cable trough and the third enclosure.

Embodiments of the cable trough assembly include providing the first cable trough with one of a tray and an insert, a first side wall constructed and arranged to secure the first side wall to the one of the tray and the insert, and a second side wall constructed and arranged to secure the second side wall to the one of the tray and the insert. The first cable trough further includes at least one first attachment configuration constructed and arranged to releasably secure the first cable trough to a first enclosure. The second cable trough further includes one of a second tray and a second insert, a third side wall constructed and arranged to secure the third side wall to one of the second tray and the second insert, and a fourth side wall constructed and arranged to secure the fourth side wall to one of the second tray and the second insert. The second cable trough further includes at least one second attachment configuration constructed and arranged to releasably secure the second cable trough to a second enclosure.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which:

FIG. 11 is a perspective view of a cable screen ladder insert of an embodiment of the disclosure;

FIG. 12 is a perspective view of a cross member of the cable screen ladder insert shown in FIG. 11;

DETAILED DESCRIPTION OF THE PREFERRED EMBODIMENTS

Figure 1:
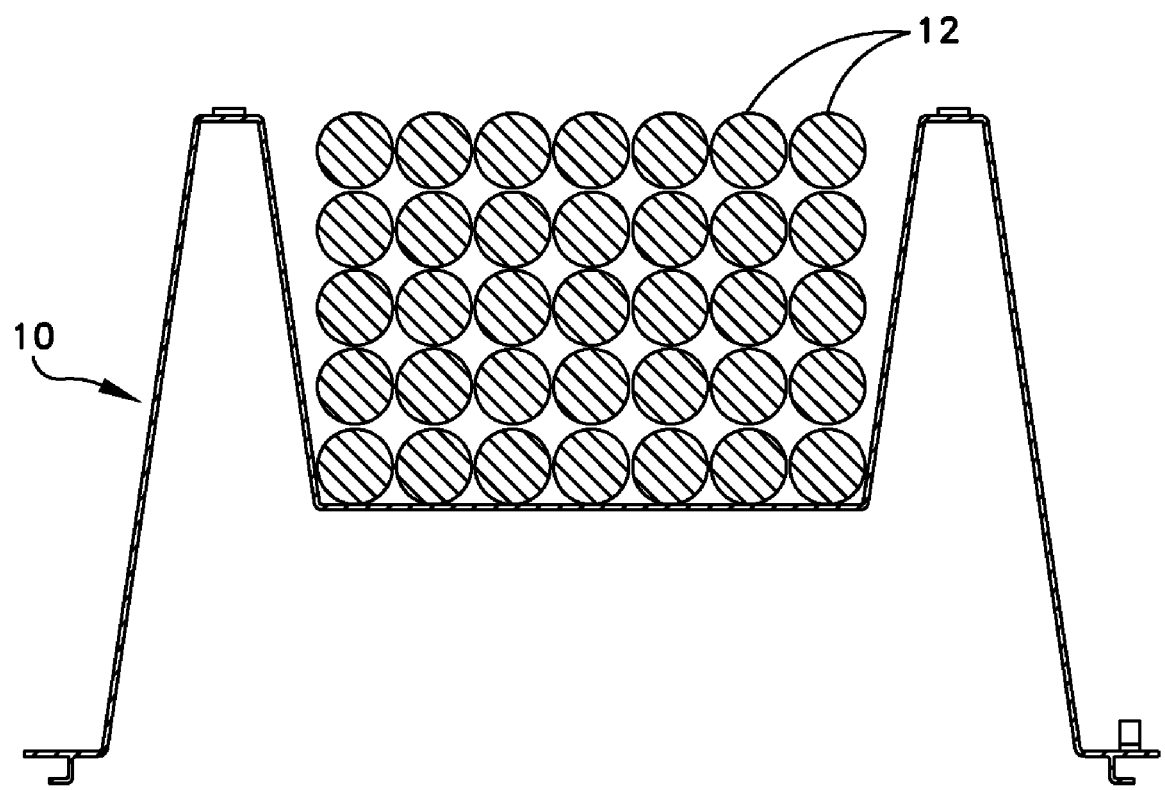
FIG. 1 is a cross-sectional view of a known cable trough assembly.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference. Other types of equipment racks, such as any equipment rack offered by American Power Conversion Corporation of West Kingston, R.I., may be used as well. As will be described in greater detail below, cabling between the equipment racks may be implemented using cable distribution troughs contained on the roofs of the racks. The principles disclosed herein may be adapted to any type of equipment rack, and may be incorporated in large data centers, smaller data centers, equipment rooms, computer rooms, and even wiring closets having more than one equipment rack. In addition, any reference to "equipment rack," "enclosure," "rack enclosure," and/or "electronics cabinet," or any variation thereof, e.g. "equipment cabinet" or "cabinet," are used interchangeably herein and are meant to describe a structure suitable for supporting and organizing electronic equipment.

Each equipment rack may be configured to include a frame or housing adapted to support electronic components, such as data processing, networking and telecommunications equipment. The housing includes a front, back, sides, a bottom and a top. The front of each equipment rack may include a front door so as to enable access into the interior of the equipment rack. A lock may be provided to prevent access into the interior of the equipment rack and the equipment housed by the equipment rack. The sides of the equipment rack may include at least one panel to enclose the interior region of the rack. The back of the equipment rack may also include at least one panel or a back door or doors to provide access to the interior of the equipment rack from the back of the rack. In certain embodiments, the side and back panels, as well as the front door and the rear door(s), may be fabricated from perforated sheet metal, for example, to allow air to flow into and out of the interior region of the equipment rack. In other embodiments, the front door may include a removable panel, either perforated, partially perforated or solid.

The equipment racks are modular in construction and configured to be rolled into and out of position, e.g., within a row of the data center. Casters (not shown) may be secured to the bottom of each equipment rack to enable the rack to roll along the floor of the data center. Once positioned, leveling feet may be deployed to securely ground the equipment rack in place within the row. Once in position, or prior to positioning the equipment rack, electronic equipment may be positioned in the interior region of the equipment rack. For example, the electronic equipment may be placed on shelves or with rack-mounted connectors secured within the interior region of the equipment rack. Cables providing electrical and data communication may be provided through the top of the equipment rack either through a cover (or "roof" as described in U.S. Pat. No. 6,967,283) at the top of the equipment rack having openings formed therein or through an open top of the equipment rack. In this embodiment, the cables may be strung along the roofs of the rack or be provided in the cable distribution troughs of embodiments of the disclosure described below. In another embodiment, the cables may be disposed within a raised floor and connected to the electronic equipment through the bottom of the equipment rack. With both configurations, power and communication lines (and any other related component) may be provided to the equipment racks. It should be understood that a cable may reference any type of cable, cord or device used to provide communication and/or power from the data center to the equipment racks or between the equipment racks.

In embodiments of this disclosure, data centers are made up of IT equipment housed by such equipment racks or in some embodiments by open frame racks. Data and power cabling are required to interconnect IT equipment in a single rack as well as across multiple racks in the data center. In addition, electrical conduits and piping are often required for cooling equipment. It is desirable to support, organize and manage such cabling and piping by use of overhead cable troughs, cable ladders and partitions. The cable trough systems and methods disclosed herein may be used for quick, tool-less installation to achieve a higher level of adjustability and capacity.

Figure 2:
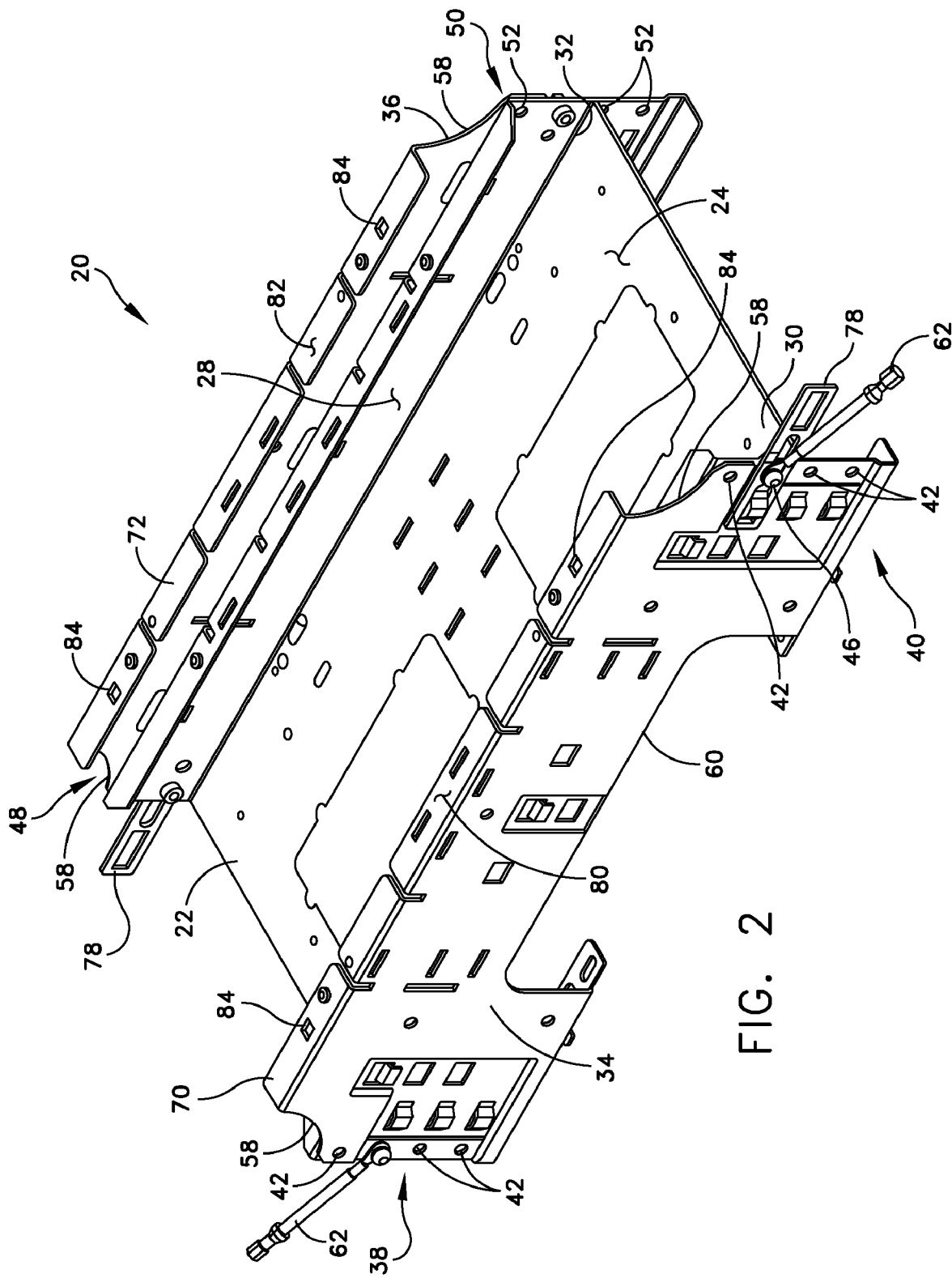
FIG. 2 is a perspective view of a cable trough assembly of an embodiment of the disclosure.
Figure 3:
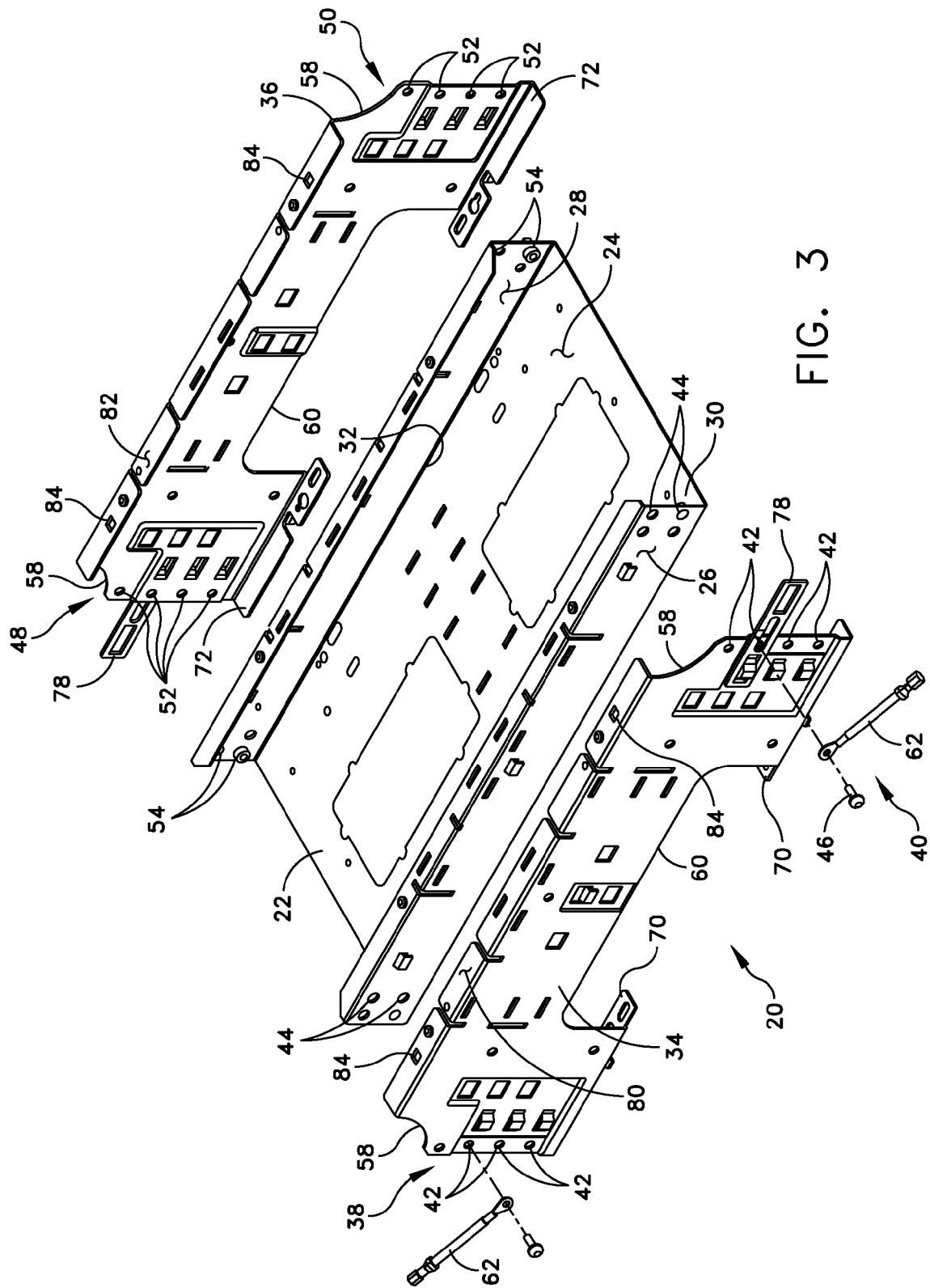
FIG. 3 is an exploded perspective view of the cable trough assembly shown in FIG. 2.

Referring to the drawings, and more particularly to FIGS. 2 and 3, cable distribution trough assembly is generally indicated at 20. As shown, the cable trough assembly 20 includes a tray 22 having a tray portion 24 and two side wall portions 26, 28. Specifically, the tray portion 24 extends along a generally horizontal plane and has two opposite side edges 30, 32. In one embodiment, the tray 22, as well as the other components of the cable trough assembly described below, is fabricated from any suitable material, such as sheet metal, that is capable of being grounded. The first side wall portion 26 extends along the side edge 30 of the tray portion 24 on a plane generally perpendicular to the plane of the tray portion. The second side wall portion 28 extends along the other side edge 32 of the tray portion 24 on a plane generally perpendicular to the plane of the tray portion. The tray portion 24 and the two side wall portions 26, 28 include any number of openings and cutouts suitable for fastening and/or receiving cables or wires there through. The more meaningful openings and cutouts will be described as the description of embodiments of the disclosure proceeds.

The cable trough assembly 20 further includes two side walls 34, 36 that are attached to respective side wall portions 26, 28 of the tray 22. The first side wall 34 and the first side wall portion 26 include two attachment configurations generally indicated at 38, 40 constructed and arranged to secure the first side wall 34 to the first side wall portion 26 of the tray 22. Specifically, one attachment configuration 38 is provided at one end of the first side wall 34 and at one end of the first side wall portion 26 and another attachment configuration 40 is provided at an opposite end of the first side wall 34 and at the opposite end of the first side wall portion 26. Each attachment configuration 38, 40 includes a plurality of openings, each indicated at 42, formed in first side wall 34, e.g., four openings 42, and two vertically aligned openings 44 formed in the first side wall portion 26 of the tray 22. The four openings 42 formed in each attachment configuration 38, 40 are arranged in a column and are thus vertically aligned with one another. The arrangement is such that at least one fastener 46, e.g., a machine screw fastener, is provided to secure the first side wall 34 to the first side wall portion 26 of the tray 22. In other embodiments, each attachment configuration 38, 40 may include another column of openings (not designated) in which two fasteners may be provided for each attachment configuration to secure the end of the side wall 34 to the first side wall portion 26 of the tray 22.

Similarly, the second side wall 36 and the second side wall portion 28 of the cable trough assembly 20 includes two attachment configurations 48, 50 constructed and arranged to secure the second side wall 36 to the second side wall portion 28 of the tray 22. One attachment configuration 48 is provided at one end of the second side wall 36 and the second side wall portion 28 and another attachment configuration 50 is provided at an opposite end of the second side wall 36 and the second side wall portion 28. As with the attachment configurations 38, 40 for the first side wall 34 and the first side wall portion 26, each attachment configuration 48, 50 includes a plurality of openings, each indicated at 52, formed in second side wall 36, e.g., four openings 52, and two openings 54 formed in the second side wall portion 28 of the tray 22. At least one fastener, such as fastener 46, is provided to secure the second side wall 36 to the second side wall portion 28 of the tray 22.

Figure 4:
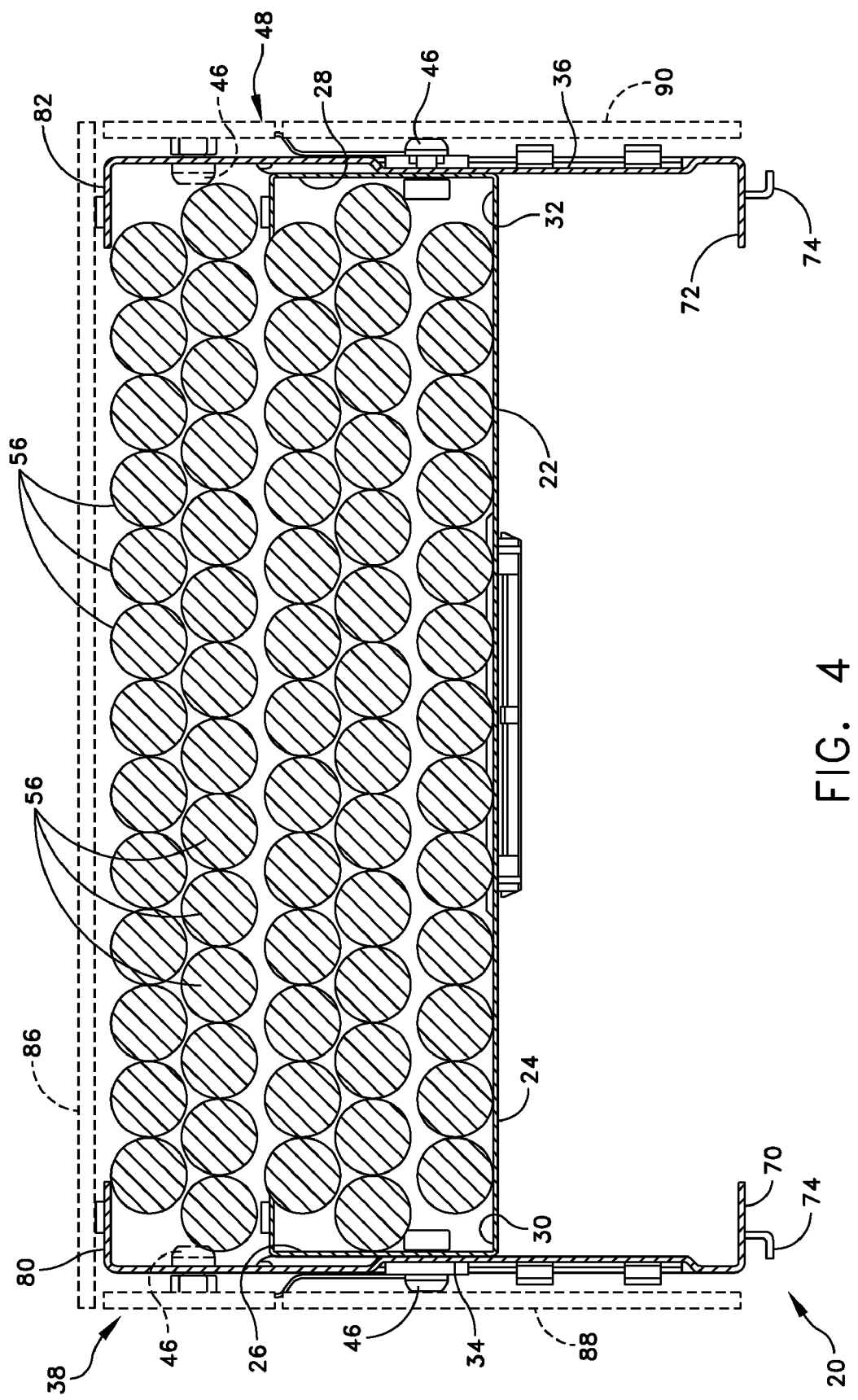
FIG. 4 is a cross-sectional view of a cable trough assembly of an embodiment of the disclosure.

The construction of the four attachment configuration 38, 40, 48, 50 enables the tray 22 to be secured to the first and second side walls 34, 36 at a selected elevation with respect to the first and second side walls. Thus, with reference to FIG. 4, the tray 22 may be secured to the first and second side walls 34, 36 to vary a vertical space below and above the tray portion 24 of the tray, depending on the particular cable requirements of the cable trough assembly 20. FIG. 4 illustrates the first and second side walls 34, 36 attached to the first and second side wall portions 26, 28 of the tray 22 at position of the second of four vertically aligned openings 42, 52 of the side walls from the upper edges of the side walls. With the shown embodiment, the cable carrying capacity depends on the size of the cable. For example, 67 runs of 50 amp power cables, each indicated at 56, are disposed in the space above the tray. The number of cables capable of being received within cable trough assembly 20 is significantly more than traditional cable troughs. The space below the tray 22 of the cable trough assembly 20 may be used to accommodate other types of cables, such as additional power cables or telecommunication cables.

It should be observed that this construction enables the cable trough assembly 20 to support any type of cable and any number of cables that may fit within the tray 22 and side walls 34, 36 of the cable trough assembly. The attachment configurations are constructed and arranged to strongly secure the side walls 34, 36 to the tray 22.

In certain embodiments, the cable trough assembly 20 may be configured so that upper corners, each indicated at 58, of the first and second side walls 34, 36 have removed portions formed therein. Additionally, each of the first and second side walls 34, 36 have a large cutout, each indicated at 60, sometimes referred as a "pass through hole" or a "mouse hole," formed midway and at the bottom of the respective first and second side walls. The purpose of the removed portions 58 and the cutout 60 is to receive cables that are directed to the rack-mounted components stored in the equipment rack. The removed portions 58 and cutout 60 enable crossover of cables from a front-to-rear and a rear-to-front of an equipment rack. In one embodiment, the cutout 60 may be ten inches in length. It should be understood that the shapes and sizes of the removed portions and the cutout may be varied to accommodate cables having differing diameters. In addition, as shown and not designated in FIGS. 2 and 3, the tray portion 24 of the tray 22 may have removed or removable portions (sometimes referred to as "knockouts") formed therein. These knockouts may be, for example, 3.75 inches by 7.75 inches.

In other embodiments, the cable trough assembly 22 may be configured to include one or more bonding wires 62, which are provided to provide a degree of ground fault protection to the set-up of the equipment rack. In one embodiment, the boding wire 62 may be an 8 AWG bonding wire that is used to replace an AWG bonding wire.

Figure 5:
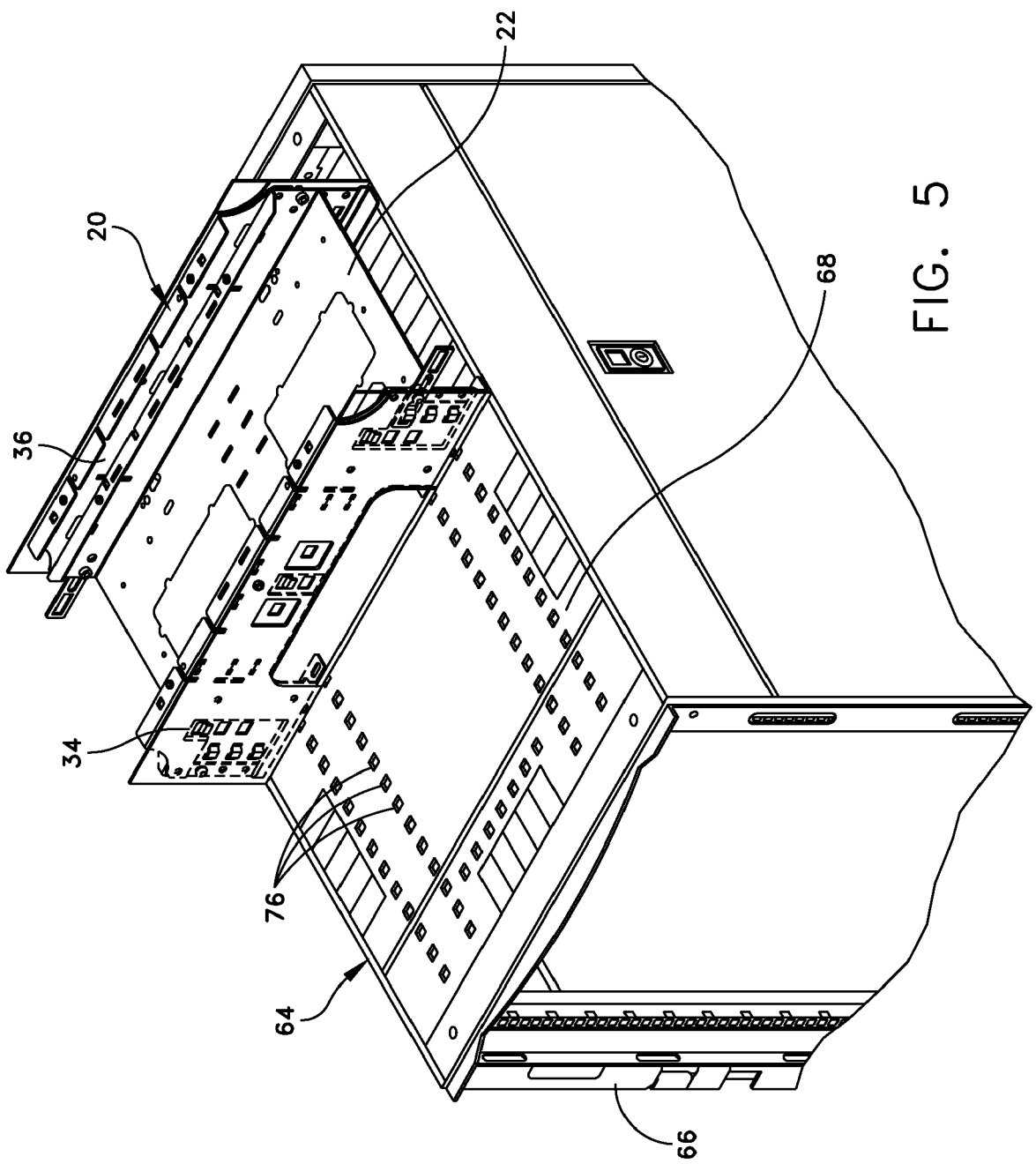
FIG. 5 is a perspective view of a cable trough assembly of an embodiment of the disclosure mounted on an equipment rack.

FIG. 5 illustrates the cable trough assembly 20 mounted on an equipment rack, which is generally indicated at 64. The equipment rack 64 includes a frame 66 having a cover or roof 68 provided at a top of the equipment rack. The cable trough assembly 20 is mounted on the cover 68 of the equipment rack 64 in such a manner that the cable trough assembly provides cable distribution in a direction transverse to a front-to-back direction of the equipment rack.

Referring back to FIGS. 2-4 in addition to FIG. 5, the first and second side walls 34, 36 include respective horizontal flange portions 70, 72, each having at least one retention hook 74 (FIG. 4) extending below its respective flange portion. The arrangement is such that the retention hook 74 is received within one of a plurality of slots or openings 76 formed in a row in the cover 68 of the equipment rack 64. The plurality of openings 76 extends from the front to the back of the equipment rack 64. This construction enables the tool-less installation of the first and second side walls 34, 36 of the cable trough assembly 20 on the equipment rack. Other attachment methods may be used, such as fasteners or some other type of attachment configuration, to secure the cable trough assembly 20 to the equipment rack 64.

Figure 6:
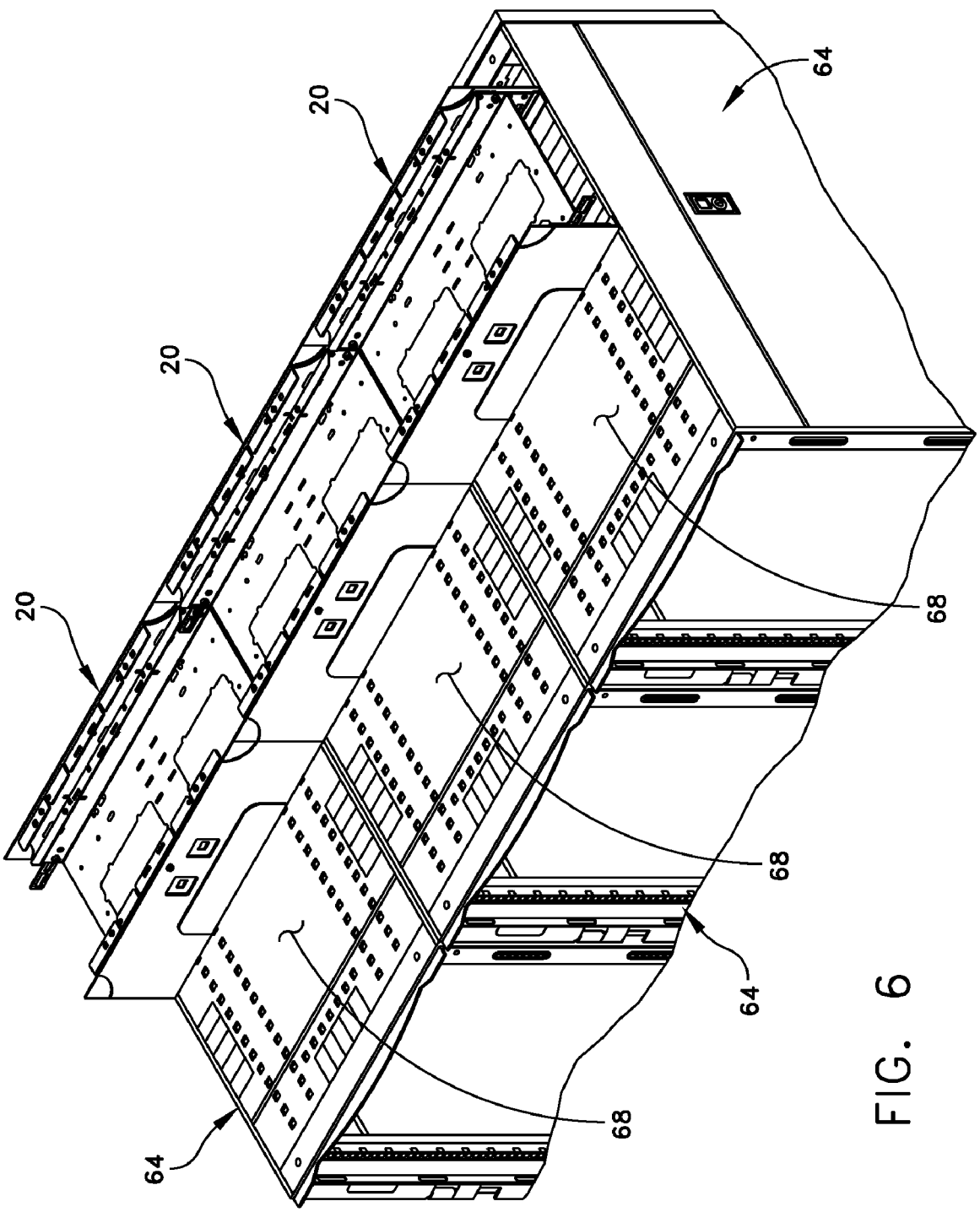
FIGS. 6-8 are perspective views illustrating multiple configurations of cable trough assemblies mounted on equipment racks of embodiments of the disclosure.
Figure 7:
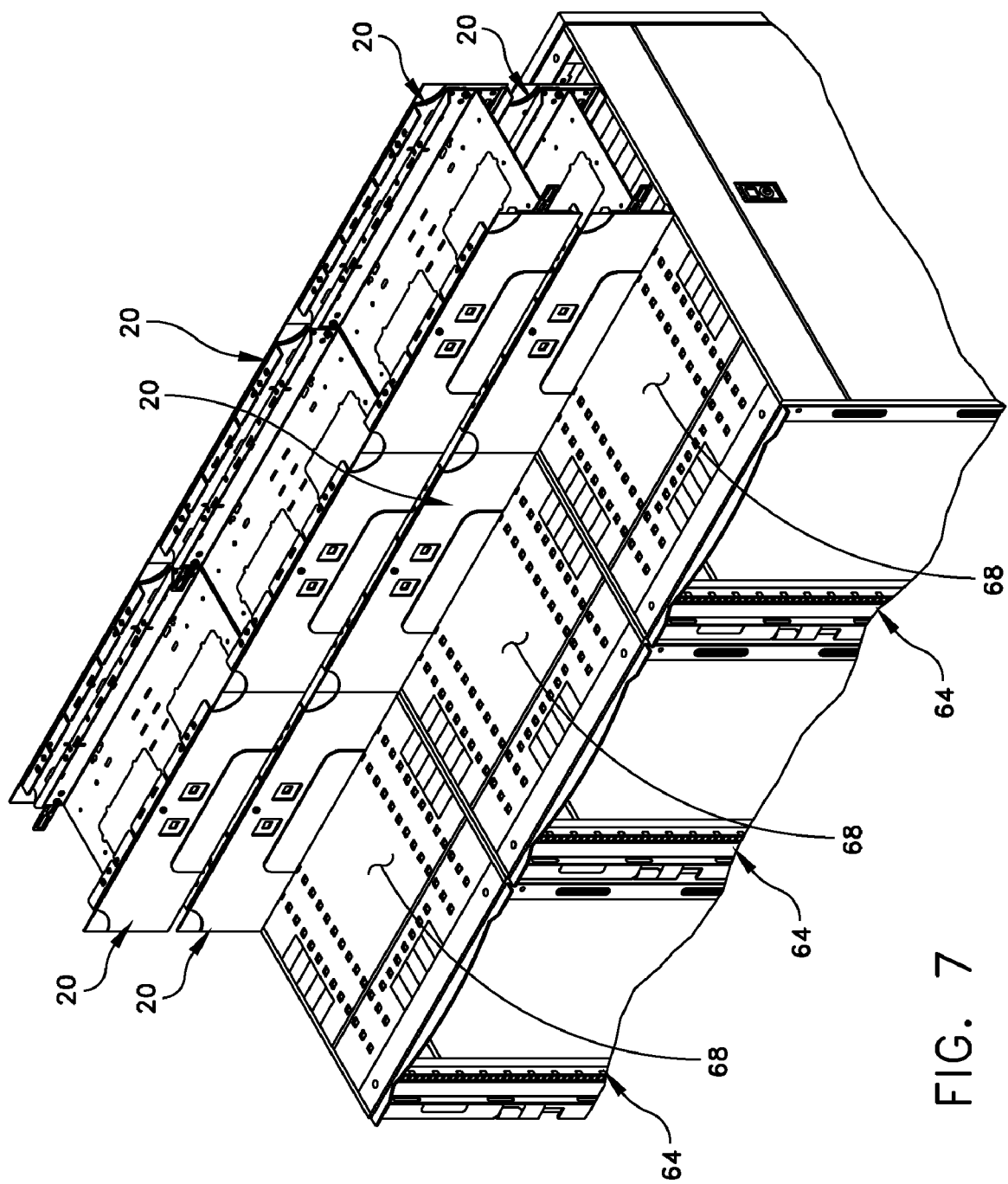
Figure 8:
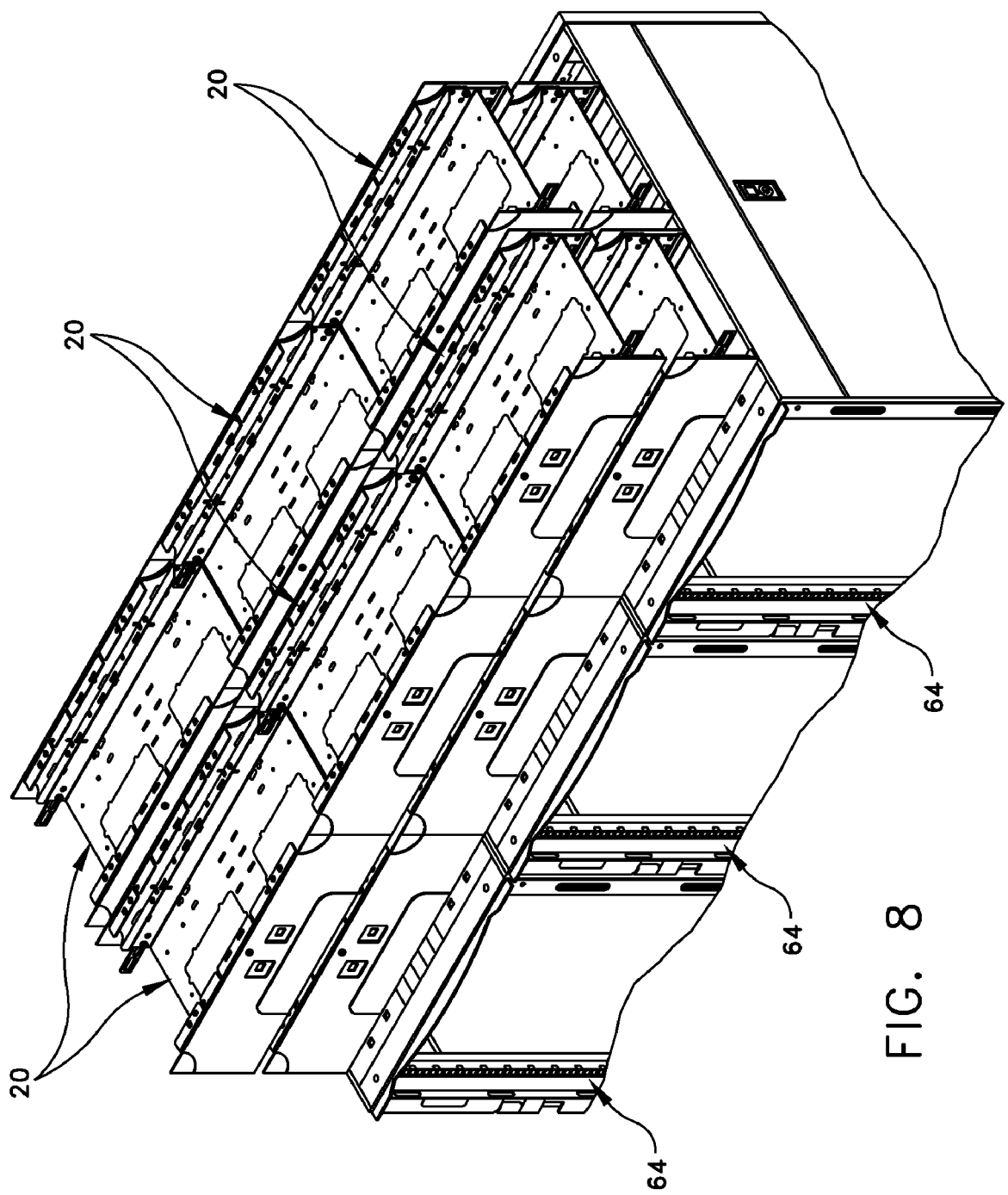

FIGS. 6-8 illustrate a variety of configurations of cable trough assemblies 20 mounted on equipment racks 64. In particular, FIG. 6 illustrates three equipment racks 64 arranged in a row with the fronts of the equipment racks being open to show the interior regions of the equipment racks. As shown, the cable trough assemblies 20 are secured to the covers 68 of the equipment racks 64 to form a cable trough channel or run configured to receive and manage cables extending across the row of equipment racks. The arrangement is such that one end of one cable trough assembly 20 abuts an end of an adjacent cable trough assembly 20 so that the first and second walls 34, 36 of the cable trough assemblies 20 are continuous along the lengths of the cable trough assemblies.

Referring back to FIGS. 2 and 3, the cable trough assembly 20 includes two interconnecting members 78 configured to secure a first cable trough assembly 20 to a second cable trough assembly 20. In one embodiment, each interconnecting member 78 includes a bracket having a series of openings formed along the length of the bracket. The openings of the bracket are configured to receive the fasteners, e.g. fasteners 46, securing the side walls 34, 36 to the side wall portions 26, 28 of the trays 22 of the cable trough assembly 20 to secure the bracket in place with respect to the first and second cable trough assemblies. FIGS. 2 and 3 illustrate one interconnecting member 78 secured to one end of the first side wall 34 and another interconnecting member 78 secured to an opposite end of the second side wall 36. Thus, when connecting two cable trough assemblies 20 to one another, the first and second side walls 34, 36 of each cable trough assembly are positively secured at both of their ends.

FIG. 7 illustrates three equipment racks 64 arranged in a row, each equipment rack 64 having a cable trough assembly 20 secured to the cover 68 of the equipment rack. As shown, the cable trough assemblies 20 secured to their respective equipment racks 64 form a first run of cable trough assemblies. For each equipment rack 64, a second cable trough assembly 20 is stacked on the first cable trough assembly 20 to create a second run of cable trough assemblies disposed above the first run of cable trough assemblies. In one embodiment, with reference to FIGS. 2-4, the first side wall 34 of each cable trough assembly 20 has an upper edge with an upper flange portion 80, which extends in the same direction as the lower flange portion 70. The upper and lower flange portions 70, 80 of the first side wall 34 extend horizontally with respect to a vertical plane of the first side wall. Similarly, the second side wall 36 of each cable trough assembly 20 has an upper edge with an upper flange portion 82, which extends in the same direction as the lower flange portion 82. As with the first side wall 34, the upper and lower flange portions 72, 82 of the second side wall 36 extend horizontally with respect to a vertical plane of the second side wall. This construction enables the second cable trough assembly 20 to be stacked on the first cable trough assembly 20. Slots or openings 84 are formed in the upper flange portions 80, 82 of the first and second side walls 34, 36 of the first run of cable trough assemblies 20 to receive the retention hooks 74 of the side walls 34, 36 of the second run of cable trough assemblies 20. The retention hooks 74 are configured to secure the second run of cable trough assemblies 20 to the first run of cable trough assemblies 20.

FIG. 8 illustrates three equipment racks 64 arranged in a row with a first cable trough assembly 20 secured to the cover (not designated in FIG. 8) of each equipment rack. As shown, for each equipment rack 64, a second cable trough assembly 20 is positioned next to the first cable trough assembly 20. The arrangement is such that the first and second cable trough assemblies 20 span nearly the entire depth of each equipment rack, and create first and second runs of cable trough assemblies, which cross over the equipment racks 64.

Figure 9:
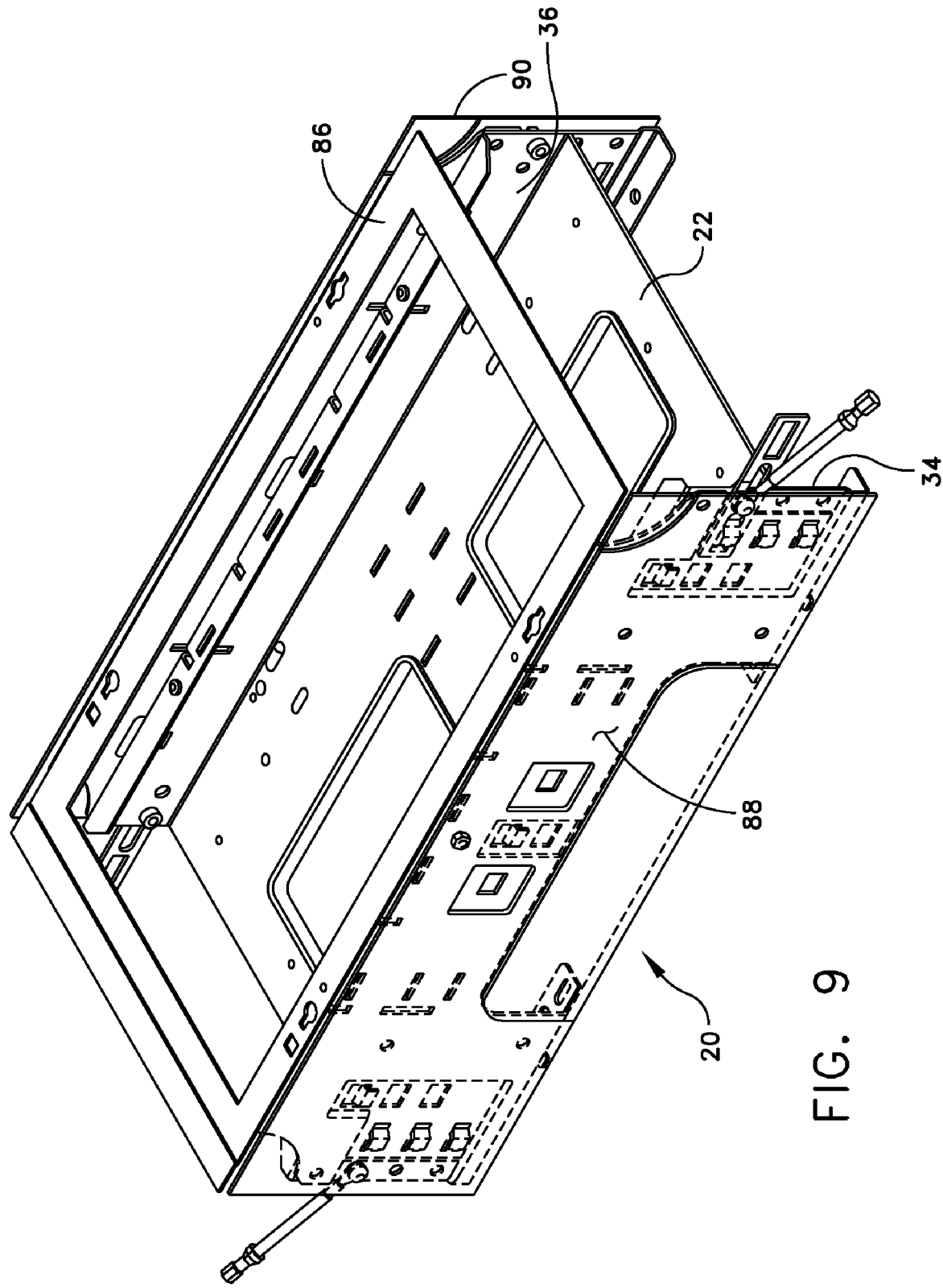
FIG. 9 is a perspective view of a cable trough assembly of another embodiment of the disclosure illustrating the cable trough assembly with top and side covers.

FIG. 9 illustrates a cable trough assembly, such as the cable trough assembly 20 described above, having a top cover 86 secured to the upper portions of the side walls 34, 36 of the cable trough assembly. The top cover 86 is configured to enclose an open top of the cable trough assembly 20 above the tray 22. The cable trough assembly 20 may further include two side covers 88, 90, one side cover 88 for the first side wall 34 and the other side cover 90 for the second side wall 36, to enclose the sides of the first and second side walls of the cable trough assembly 20. The top cover 86 and the side wall covers 88, 90 may be suitably secured to the first and second side walls 34, 36 of the cable trough assembly 20 by fasteners, such fastener 46 illustrated in dashed lines in FIG. 4. As shown, the top cover 86 and the side wall covers 88, 90 are configured to enclose the interior region of the cable trough assembly 20 to create an organized and clean appearance. The covers 86, 88, 90 may also be configured with knockouts to enable cables to extend through the covers secured to the cable trough assembly 20.

Figure 10:
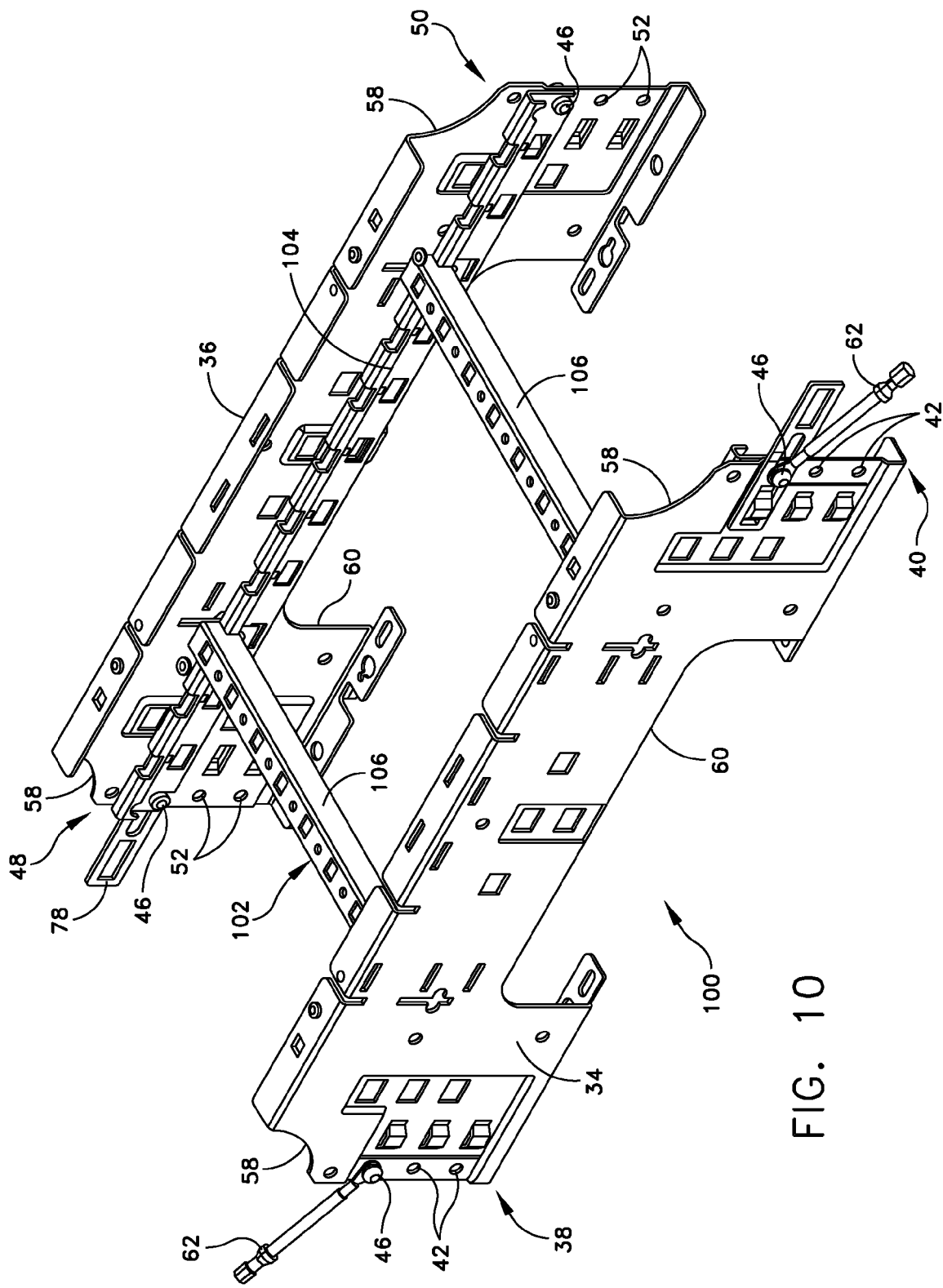
FIG. 10 is a perspective view of a cable trough assembly of another embodiment of the disclosure.

Referring now to FIG. 10, generally indicated at 100 is a cable trough assembly of another embodiment of the disclosure. As shown, the cable trough assembly 100 is similarly constructed as cable trough 20 except for the provision of the tray 22. The cable trough assembly 100 includes a cable screen ladder insert, generally indicated at 102, a first side wall 34 and a second side wall 36. The first and second side walls 34, 36 are identical in construction to the first and second side walls of cable trough assembly 20, and, accordingly, are identically designated in FIG. 10. In certain embodiments, the insert 102 is configured to replace the tray 22 of cable trough assembly 20 to achieve an open bottom configuration of the cable trough assembly. In one embodiment, the cable trough assembly 100 is fabricated from any suitable material, such as sheet metal, that is capable of being grounded.

With additional reference to FIGS. 11 and 12, in the shown embodiment, the insert 102 of the cable trough assembly 100 includes two longitudinal members, each indicated at 104, and two cross members, each indicated at 106. Each longitudinal member 104 includes an elongated body 108, which is configured with a plurality of slots 110 formed on an upper surface of the body along the length of the longitudinal member. As shown, each slot 110 is sized to receive an elongated body 112 of the cross member 106 therein so that the cross member is seated with respect to the longitudinal member 104 within the slot.

To secure an end of the cross member 106 to the longitudinal member 104, each end of the cross member include a tab 114, which extends downwardly with respect to the cross member. As shown in FIG. 12, the tab 114 has an opening 116 formed therein to receive a fastener, such as fastener 46, which is used to secure the tab to the body 108 of the longitudinal member 104. Each longitudinal member 104 has plurality of openings, each designated at 118 formed along the length of the elongated body 108 of the longitudinal member to secure the cross member 106 in place with respect to the longitudinal member. Thus, the provision of the slots 110 and the openings 118 enable the cross members 106 to be positioned and secured to the longitudinal members 104 at any position along the length of the bodies 108 of the longitudinal members. It should be understood that although two cross members 106 are illustrated in FIGS. 10 and 11, any number of cross members may be used to provide support for cables extending over the cross members.

Each longitudinal members 104 of the insert 102 further includes a slot 120 formed adjacent an end of the elongated body 108 to secure the longitudinal member in place on respective side wall 34, 36 of the cable trough assembly 100. FIG. 10 illustrates fasteners 46 securing the insert 102 to the side walls 34, 36. As with cable trough 20, the first side wall 34 of cable trough assembly 100 includes two attachment configurations 38, 40 constructed and arranged to secure the first side wall 34 to the longitudinal member 104. As with cable trough assembly 20, the four openings 42 are arranged in a column so that they are vertically aligned with one another. The arrangement is such that at least one fastener, fastener 46, is provided to secure the first side wall 34 to the longitudinal member 104 of the insert 102. Similarly, the second side wall 36 includes two attachment configurations 48, 50 constructed and arranged to secure the second side wall to the other longitudinal member 104 of the insert 102.

As with cable trough assembly 20, the construction of cable trough 100 enables the insert 102 to be secured to the first and second side walls 34, 36 at a selected elevation with respect to the first and second side walls. Thus, the insert 102 may be secured to the first and second side walls 34, 36 to vary a vertical space below and above the insert, depending on the particular cable requirements of the cable trough assembly 100.

Referring back to FIG. 10, in certain embodiments, the cable trough assembly 100 may be configured so that upper corners 58 of the first and second side walls 34, 36 have removed or removable knockouts formed therein. Additionally, each of the first and second side walls 34, 36 of the cable trough assembly 100 have a large cutout or a mouse hole 60 formed midway and at the bottom of the first and second side walls.

The cable trough assembly 100 may be mounted on an equipment rack in a manner similar to the mounting of cable trough assembly 20 on equipment rack 64. The cable trough assembly 100 is mounted on the cover 68 of the equipment rack 64 in such a manner that the cable trough assembly provides cable distribution in a direction transverse to a front-to-back direction of the equipment rack.

Figure 13:
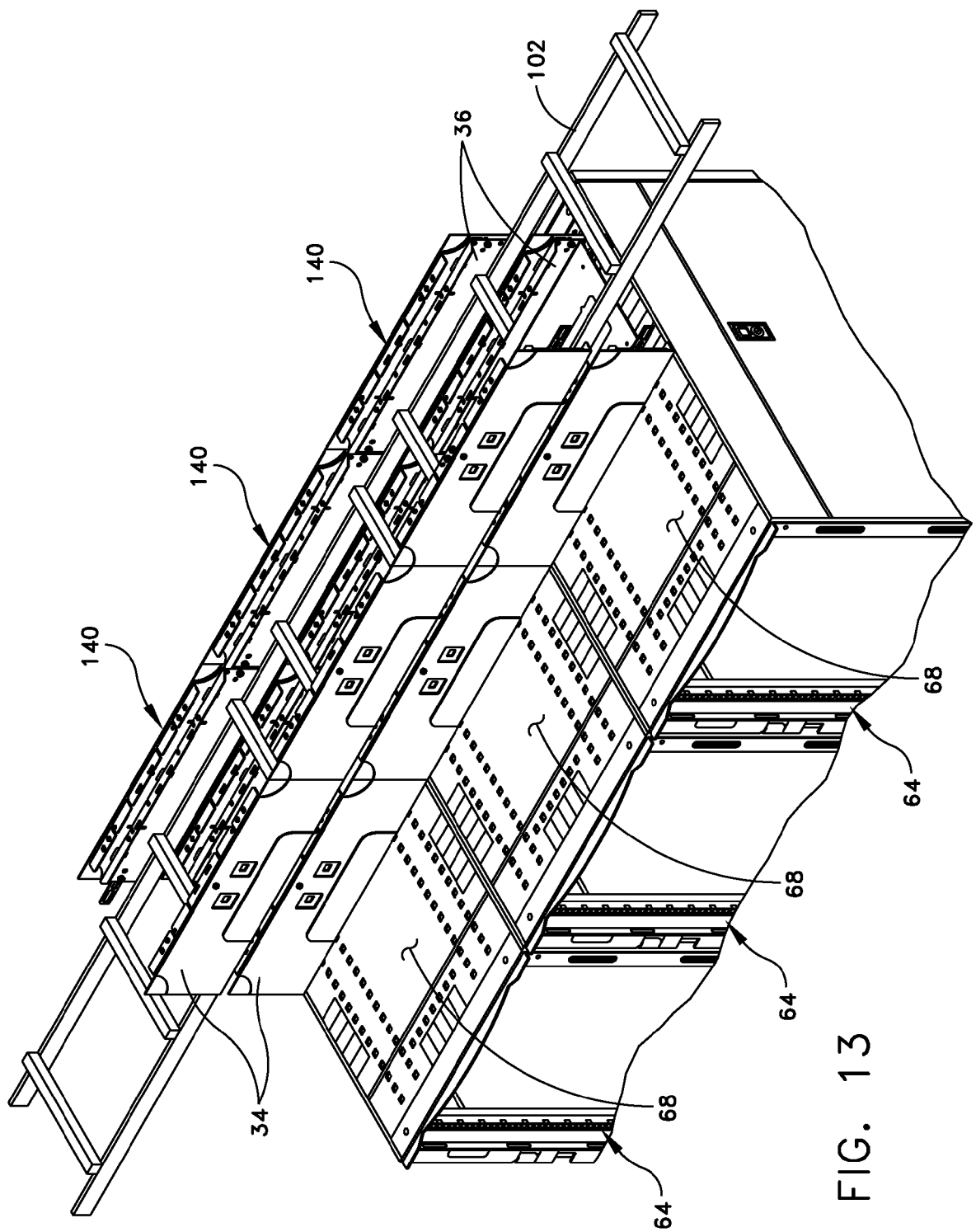
FIG. 13 is a perspective view of several cable trough assemblies having cable screen ladder inserts installed on several equipment racks.
Figure 14:
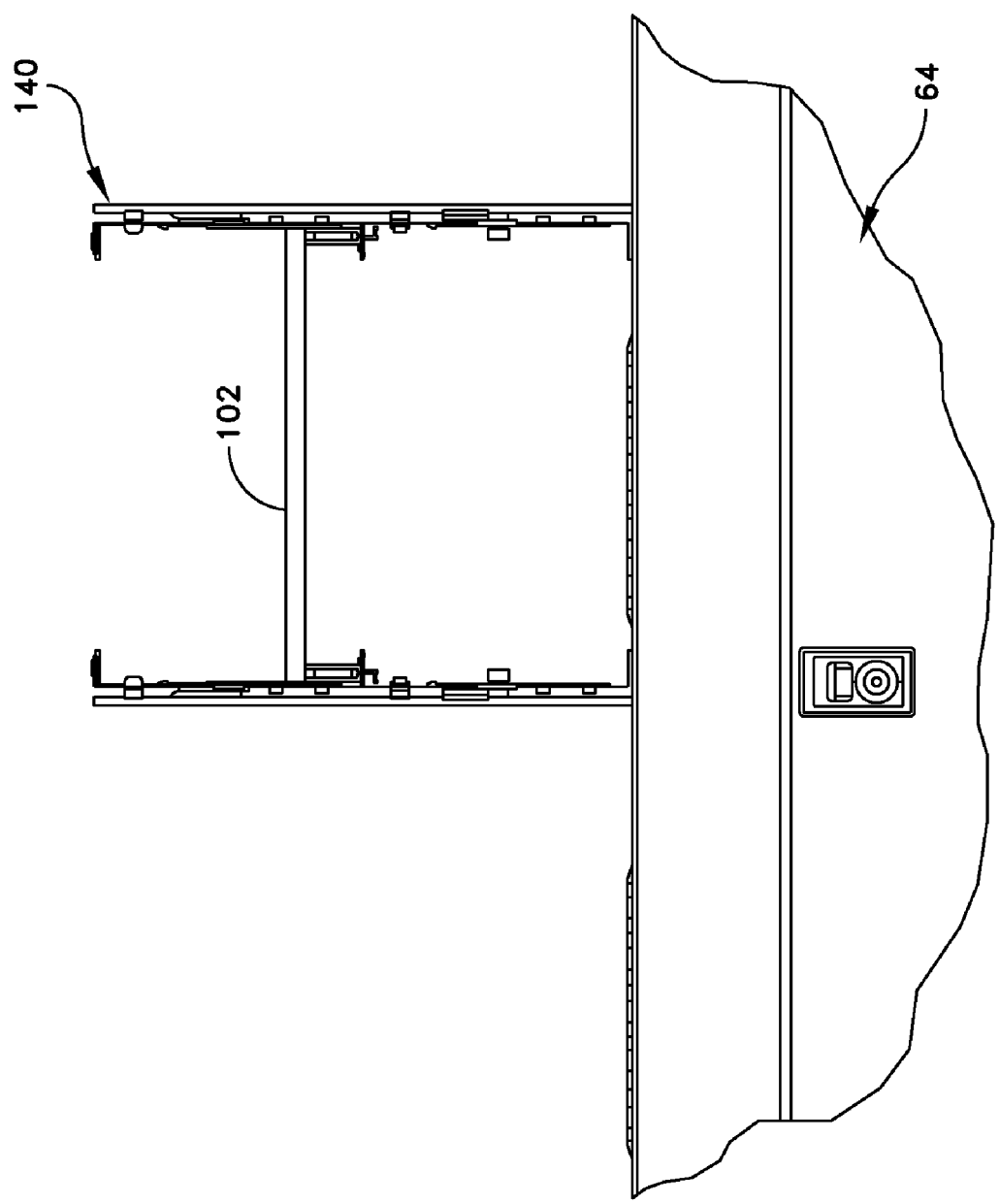
FIGS. 14 and 15 are end views illustrating two configurations of cable trough assemblies having cable screen ladder inserts.

FIGS. 13 and 14 illustrate several cable trough assemblies, generally indicated at 140, which are similar to cable trough assembly 100. Each cable trough assembly 140 includes a screen ladder insert 102. As shown, three equipment racks 64 are arranged in a row and each cable trough assembly 140 includes a double wall configuration having stacked first and second walls 34, 36. The cable screen ladder insert 102 is secured to the stacked first walls 34 and the stacked second walls 36 near the attachment of the respective first walls and respective second walls. Thus, the insert 102 is secured to the stacked first walls 34 and the stacked second walls 36 near the midpoint of the intersection between the respective first walls and the respective second walls. The elevation of the insert 102 with respect to the stacked first and second side walls 34, 36 is best shown in FIG. 14. The insert 102 may be secured to the stacked first and second side walls at a desired elevation by using the attachment configurations 38, 40, 48, 50 described above. The cable trough assembly 140 shown in FIGS. 13 and 14 essentially doubles the height of the cable trough assembly (as compared to cable trough assemblies 20, 100) and achieves an open bottom, which may be desirable when running larger cables, such as power cables, into the equipment racks 64. In one embodiment, the cable trough assembly 140 is fabricated from any suitable material, such as sheet metal, that is capable of being grounded.

Figure 15:
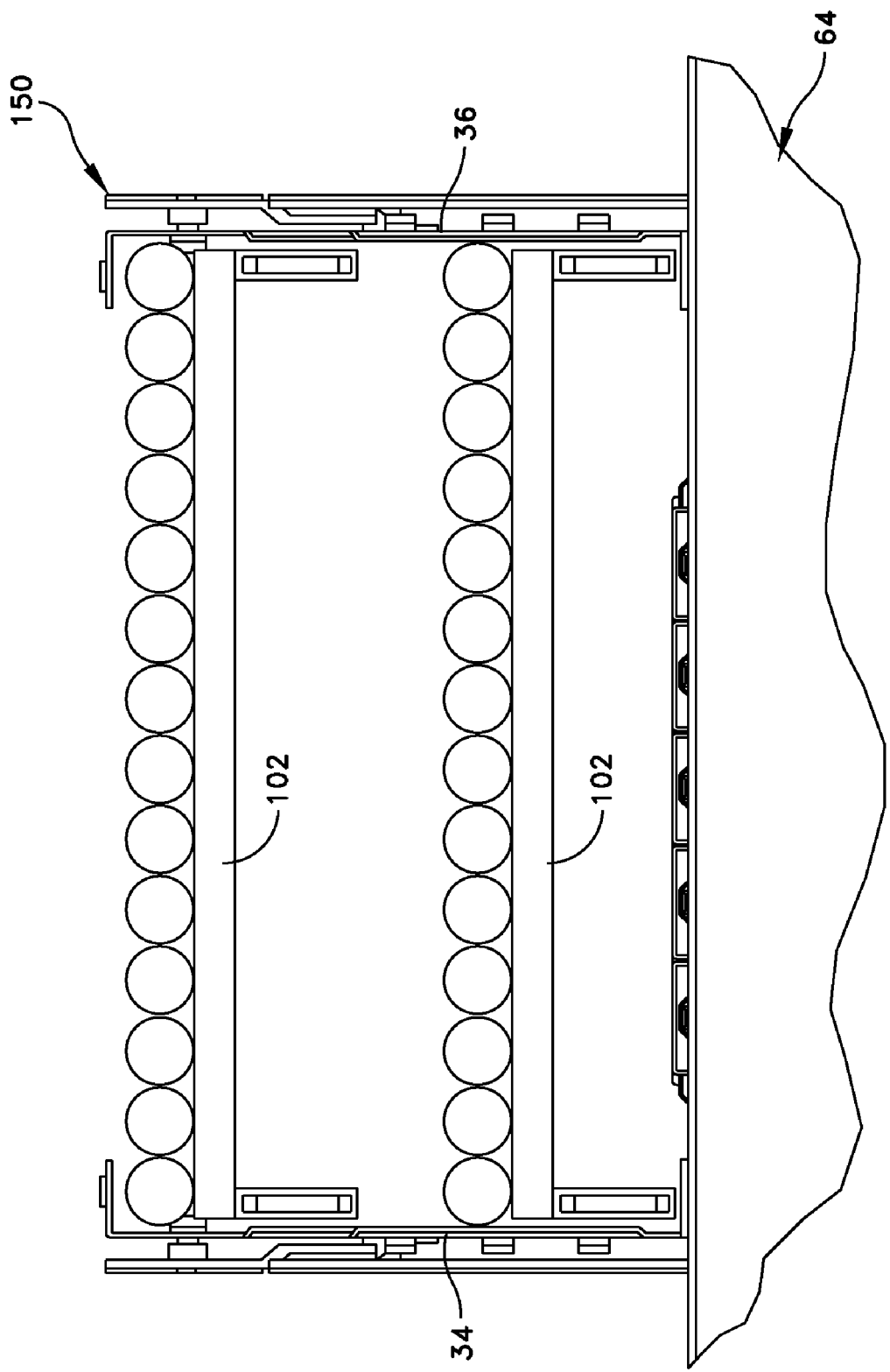

FIG. 15 illustrates a cable trough assembly, generally indicated at 150, having a double cable screen ladder insert configuration suitable for channeling larger cables, such as power cables. As shown, the cable trough assembly 150 includes two cable screen ladder inserts 102 suitably secured to a first side wall 34 and a second side wall 36. The manner in which the inserts 102 are secured to the first and second side walls 34, 36 is the same as the manner in which the insert 102 is secured to the first and second side walls 34, 36 of cable trough assembly 100 described above. As shown, each insert 102 of cable trough 150 is configured to run or channel cables along the length of the cable trough assembly. In one embodiment, the cable trough assembly 150 is fabricated from any suitable material, such as sheet metal, that is capable of being grounded.

Figure 16:
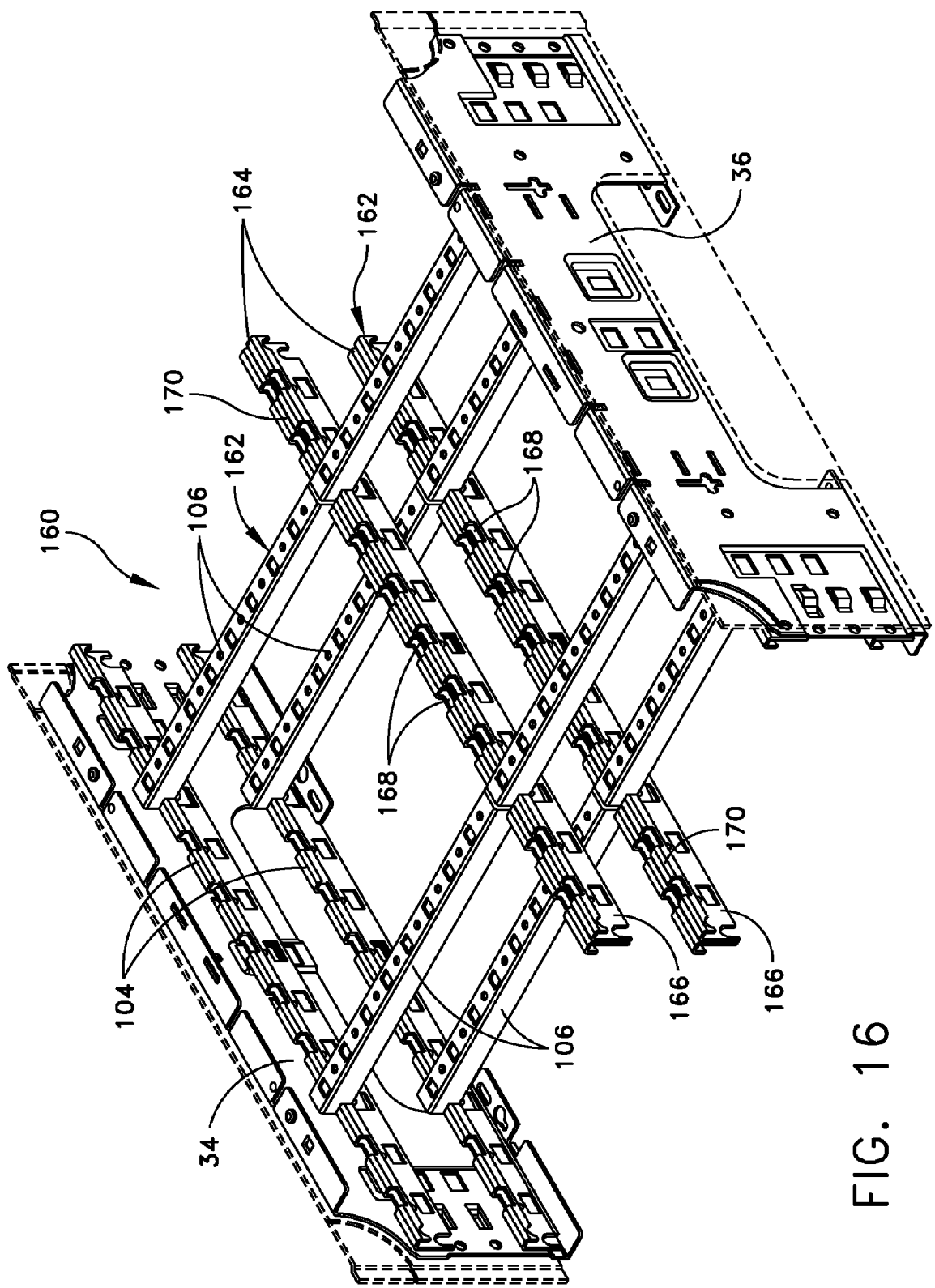
FIG. 16 is a perspective view of a cable trough assemblies having a cable screen ladder insert of another embodiment of the disclosure.

Turning to FIG. 16, there is generally indicated at 160 a cable trough assembly of another embodiment of the disclosure. As shown, the cable trough assembly 160 includes two wide cable screen ladder inserts generally indicated at 162, a first side wall 34 and a second side wall 36. In certain embodiments, the wide inserts 162 are configured to replace the tray 22 of cable trough assembly 20 to achieve an open bottom configuration of the cable trough assembly 160 and to increase the width of the cable trough assembly 160. In one embodiment, the cable trough assembly 160 is fabricated from any suitable material, such as sheet metal, that is capable of being grounded.

Each wide insert 162 includes two longitudinal members 104, one specially configured longitudinal member 164, and four cross members 106. The construction of the longitudinal members 104 and the cross members 106 is the same as the construction of the longitudinal members 104 and the cross members 106 of insert 102. Thus, the manner in which the longitudinal members 104 of insert 162 are secured to respective side walls 34, 36 of cable trough assembly 160 is the same as the manner in which insert 102 is secured to respective side walls 34, 36 of cable trough assembly 100.

The specially configured longitudinal member 164, which may be referred to as a middle longitudinal member since it is positioned between the two longitudinal members 104, is configured to secure ends of the cross members 106 that are opposite to the ends secured to the longitudinal members 104. As with each longitudinal member 104, the middle longitudinal member 164 includes an elongated body 166, which is configured with slots 168 formed on an upper surface of the body of the longitudinal member along the length of the longitudinal member. As shown, each slot 168 of the middle longitudinal member 164 is sized to receive an elongated body of the cross member 106 therein so that the cross member is seated with respect to the middle longitudinal member within the slot. The middle longitudinal member 164 further includes an elongated slot 170 formed in a top surface of the elongated body along the length of the elongated body. Slot 170 runs in a direction perpendicular to the direction of slots 168. To secure an end of the cross member 106 to the middle longitudinal member 164, the tab of the cross member is received within the slot 170 of the elongated body 166 of the middle longitudinal member to secure the end of the cross member in place with respect to the middle longitudinal member. The slot 170 is of sufficient width to receive the tab of the cross member 106 extending from the other side wall.

The two wide inserts 162 are suitably secured to the first and second side walls 34, 36 at a selected elevation with respect to the first and second side walls. The cable trough assembly 160 may be mounted on an equipment rack, such as equipment rack 64, in a manner similar to the mounting of the cable trough assemblies described above. The cable trough assembly 160 is mounted on the cover of the equipment rack in such a manner that the cable provides cable distribution in a direction transverse to a front-to-back direction of the equipment rack. The provision of two wide inserts 162 of cable trough assembly 160 enables a large number of cables to be run over the inserts.

Figure 17:
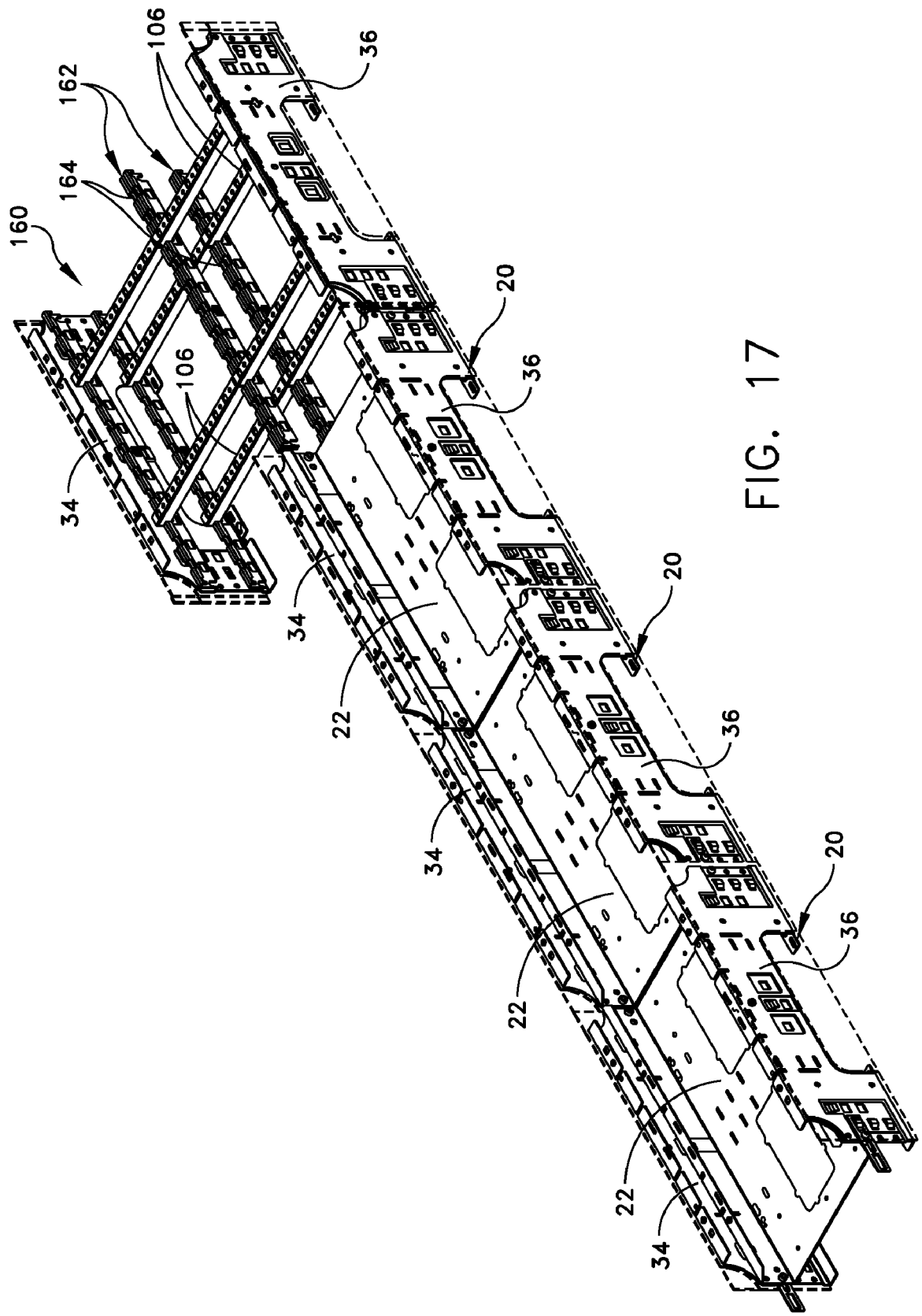
FIG. 17 is a perspective view of several cable trough assemblies in combination with a cable trough assembly having a cable screen ladder insert shown in FIG. 16.

FIG. 17 illustrates several cable trough assemblies, such as cable trough assembly 20, in combination with the cable trough assembly 160 having the wide cable screen ladder inserts 162 shown in FIG. 16. As shown, three cable trough assemblies 20 are arranged end-to-end to create a run having a width the width of the tray 22 of the cable trough assemblies 20. The cable trough assembly 160 is arranged with respect to the cable trough assemblies 20 such that the side wall 36 of the cable trough assembly 160 is connected to the side wall 36 of the cable trough assembly 20. In one embodiment, the connection may be achieved by the interconnecting member (not shown). Similarly, free ends of the middle longitudinal members 164 are connected to the side wall 34 of the cable trough assembly 20 with the interconnecting member. As shown, the side wall 34 of the cable trough assembly 160 extends beyond the side wall 34 of the cable trough assembly 20 to double the width of the cable trough configuration. This arrangement is particularly suited for situations in which a particular equipment rack requires a large run of cables.

Figure 18:
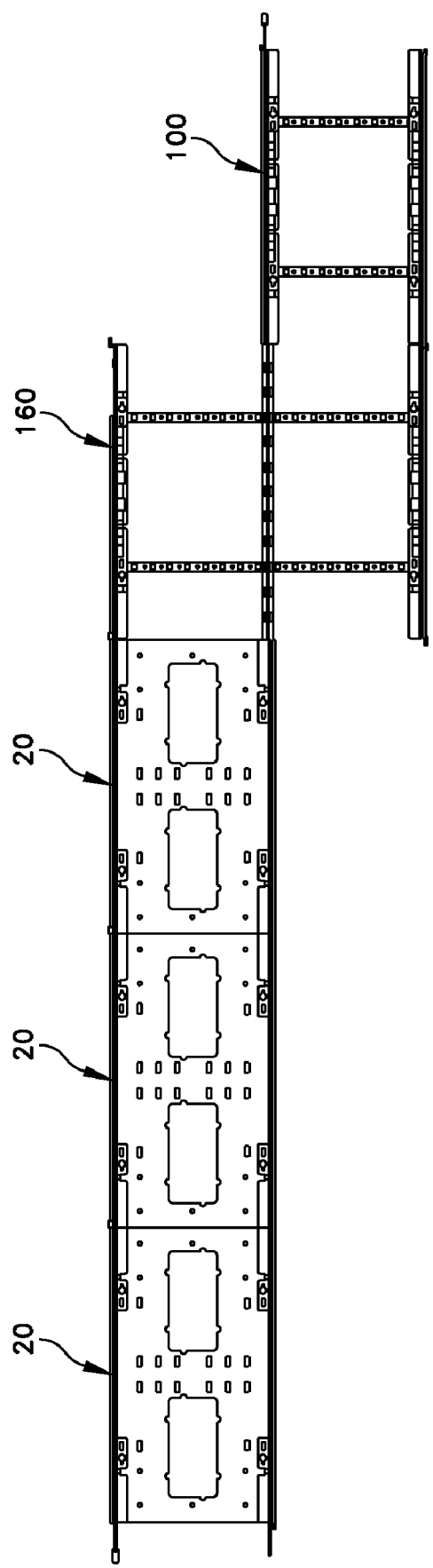
FIG. 18 is a top plan view of a combination of cable trough assemblies of another embodiment of the disclosure.

FIG. 18 illustrates a cable trough configuration similar to the cable trough configuration shown in FIG. 17, with an additional cable trough assembly, such as cable trough assembly 100, connected to cable trough assembly 160. This arrangement is particularly suited for situations in which a particular equipment rack requires a large run of cables to gradually transition from a front-to-rear of the equipment rack roof or vice versa, or when cables are required to be shifted above the equipment racks, e.g., in row offset applications.

Figure 19:
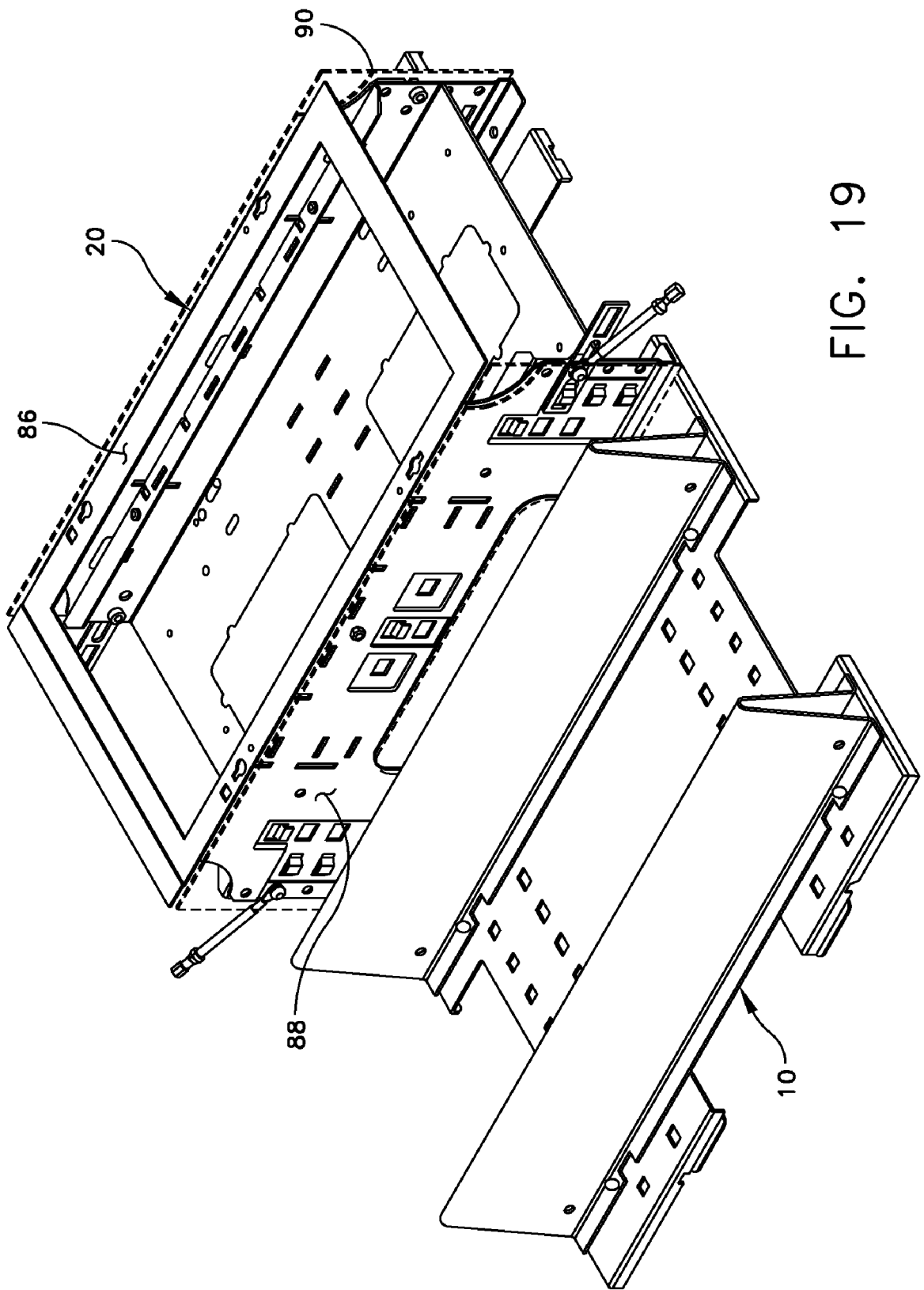
FIGS. 19-21 are perspective views of cable trough assemblies of embodiments of the disclosure.
Figure 20:
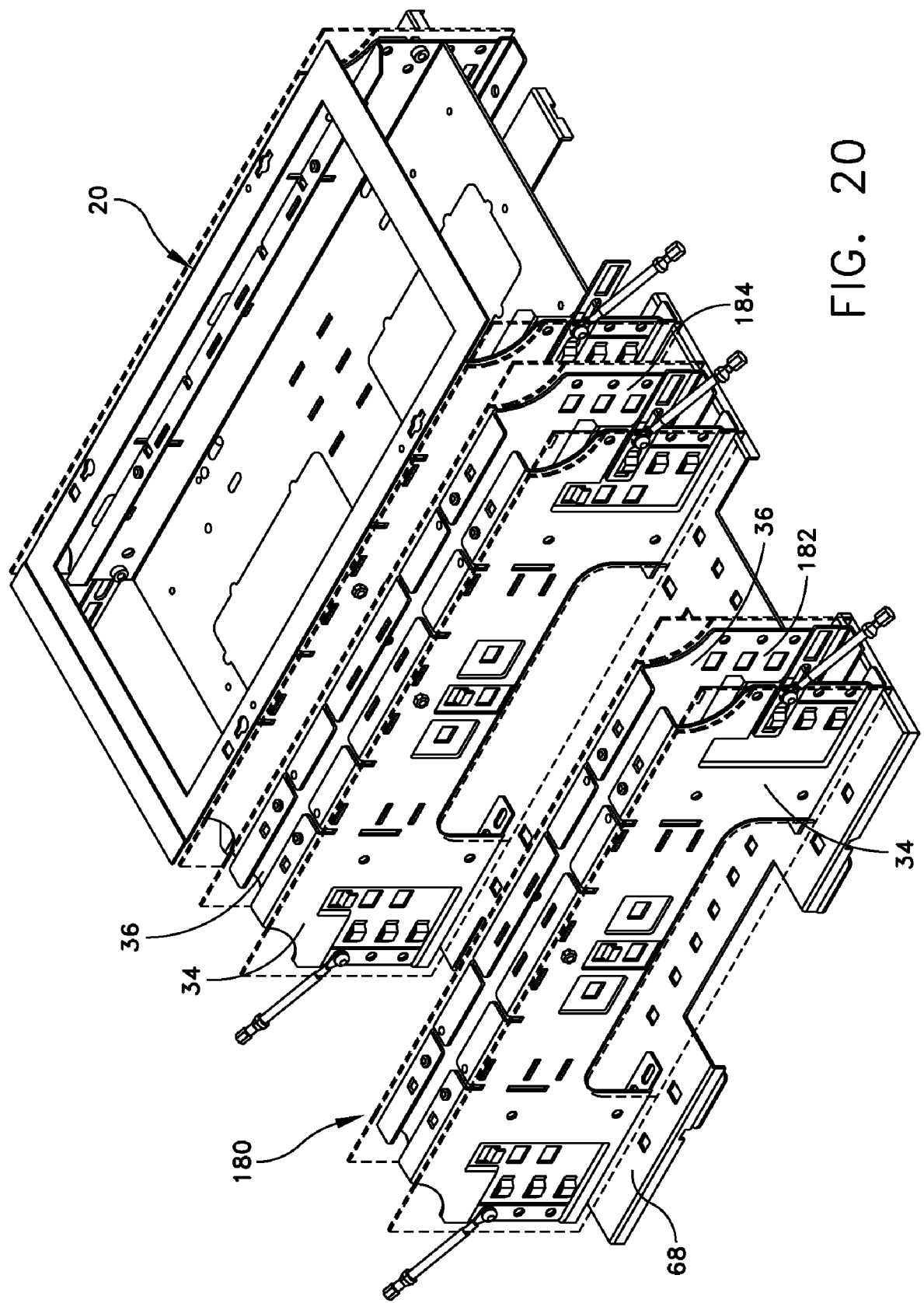
Figure 21:
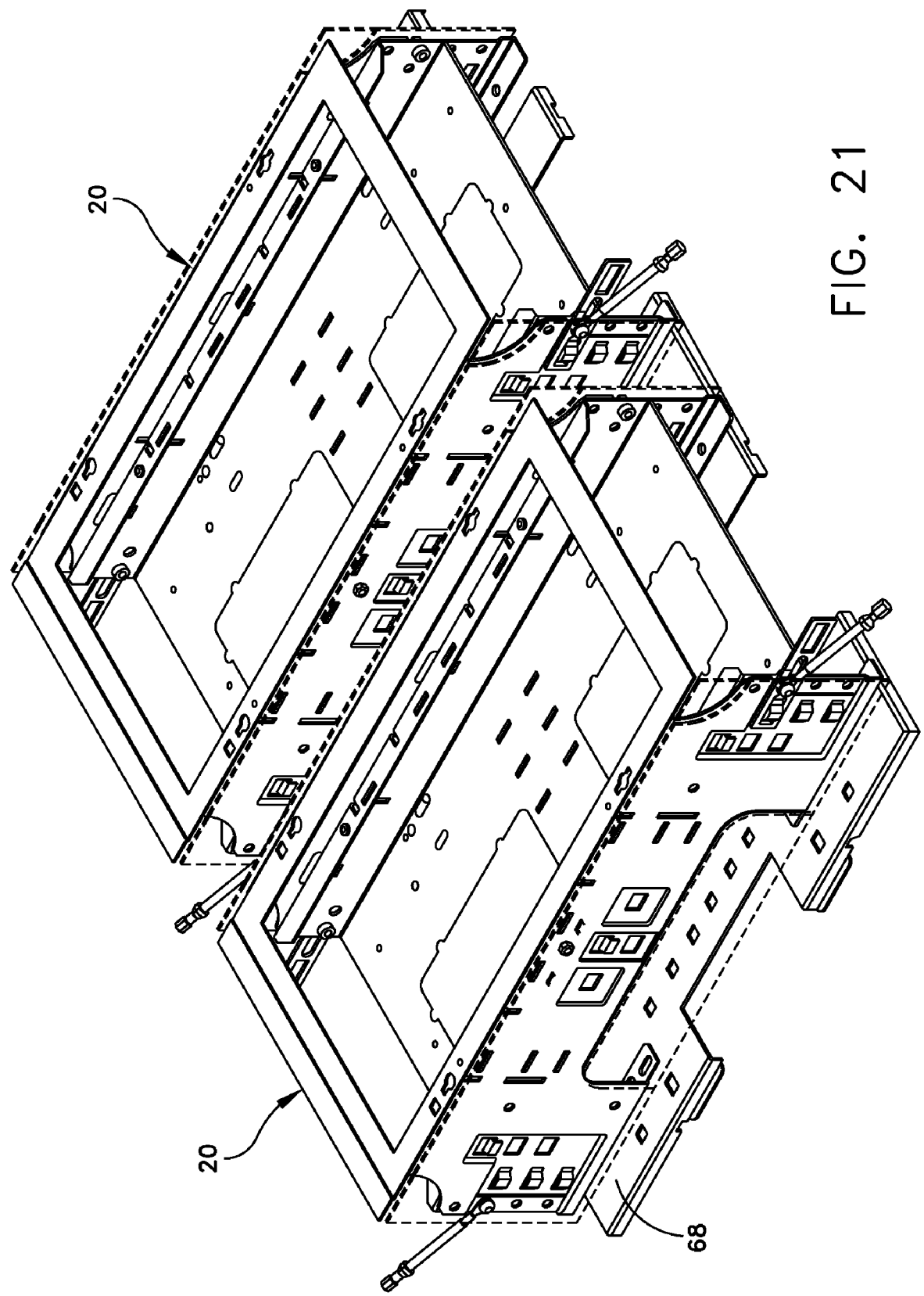

Referring to FIGS. 19-21, and more particularly to FIG. 19, illustrate a cable trough assembly, such as the cable trough assembly 20 shown in FIG. 9, and a standard cable trough, such as cable trough 10, positioned adjacent the cable trough assembly 20. The cable trough assembly 20 includes a top cover 86 and side covers 88, 90 to enclose the top and the sides of the cable trough assembly.

FIG. 20 illustrates a cable trough assembly, such as the cable trough assembly 20, and a cable trough assembly 180 of another embodiment of the disclosure. The cable trough assembly includes four side walls, with two side walls 34, 36 positioned adjacent one another to create a first longitudinal channel 182 the other two side walls 34, 36 positioned adjacent one another to create a second longitudinal channel 184. Each side wall 34, 36 may be secured directly to the cover 68 of the equipment rack (not designated). As shown in dashed lines, the cable trough assembly 20 includes the top cover and the side covers to enclose the open top and the sides of the cable trough assembly. Side covers may also be provided for cable trough assembly 180. In one embodiment, the cable trough assembly 180 is fabricated from any suitable material, such as sheet metal, that is capable of being grounded.

FIG. 21 illustrates two cable trough assemblies, such as cable trough assembly 20, positioned next to one another. The cable trough assemblies 20 are secured to the cover 68 of the equipment rack in the manner described above. The cable trough configurations illustrated in FIGS. 19-21 are particularly suited for running data cables.

Figure 22:
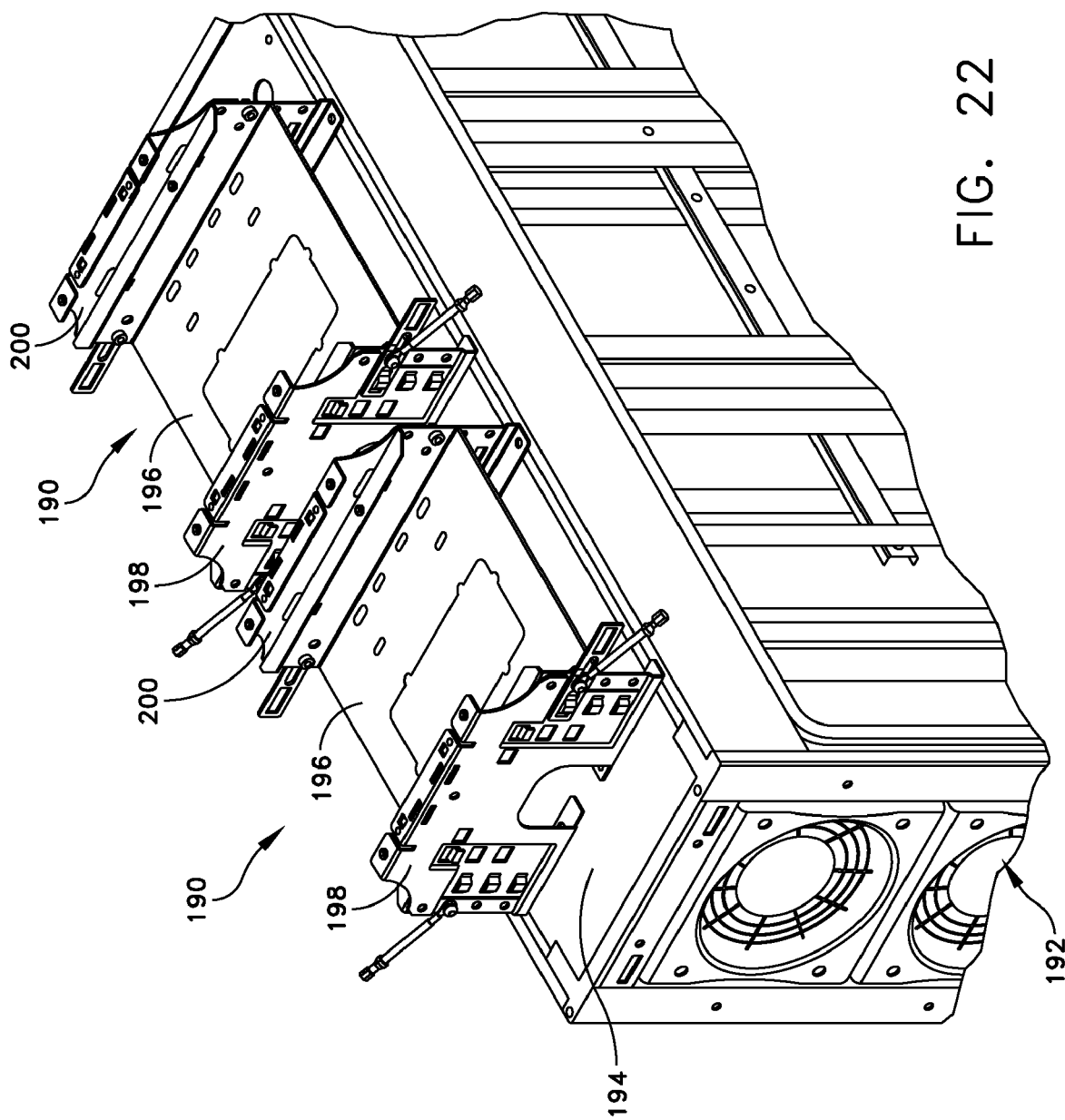
FIG. 22 is a perspective view of two cable trough assemblies of embodiments of the disclosure mounted on a cooling rack.

FIG. 22 illustrates two cable trough assemblies, each generally indicated at 190, mounted on a cooling rack generally indicated at 192. In order to address the heat build-up and hot spots within the data center or equipment room, and to address climate control issues within the data center or room in general, one or more cooling racks, such as cooling rack 192, may be provided. In one configuration, the cooling rack 192 may be a modular cooling rack, such as the modular system described in pending U.S. patent application Ser. No. 11/335,874, entitled COOLING SYSTEM AND METHOD, filed on Jan. 19, 2006, or in U.S. patent application Ser. No. 11/504,382, entitled METHOD AND APPARATUS FOR COOLING, filed on Aug. 15, 2006, both of which are owned by the assignee of the present disclosure and is incorporated herein by reference. The modular cooling system may include a plurality of cooling racks strategically disposed within the data center. The top or cover 194 of the cooling rack 192 may be configured with a plurality of slots or openings (not shown) formed in a row in the cover of the cooling rack. In a certain embodiment, the cooling rack 192 may be configured to be one-half the width of the equipment rack, such as equipment rack 64. In such an embodiment, the cable trough assemblies 190 are shortened in a lengthwise direction as defined by the run of cables (not shown), as shown in FIG. 22, to accommodate the width of the cooling rack 192.

Each cable trough assembly 190 includes a tray 196 and two side walls 198, 200, which are constructed similarly as tray 22 and side walls 34, 36 as cable trough assembly 20. The only difference in their construction is that the lengths of the tray 196 and the two side walls 198, 200 of cable trough assembly 190 are shorter than the lengths of the tray 22, and the side walls 34, 36 of cable trough assembly 20. Otherwise, the construction and the attachment of the various components of cable trough assembly 190 is identical to cable trough assembly 20.

Figure 23:
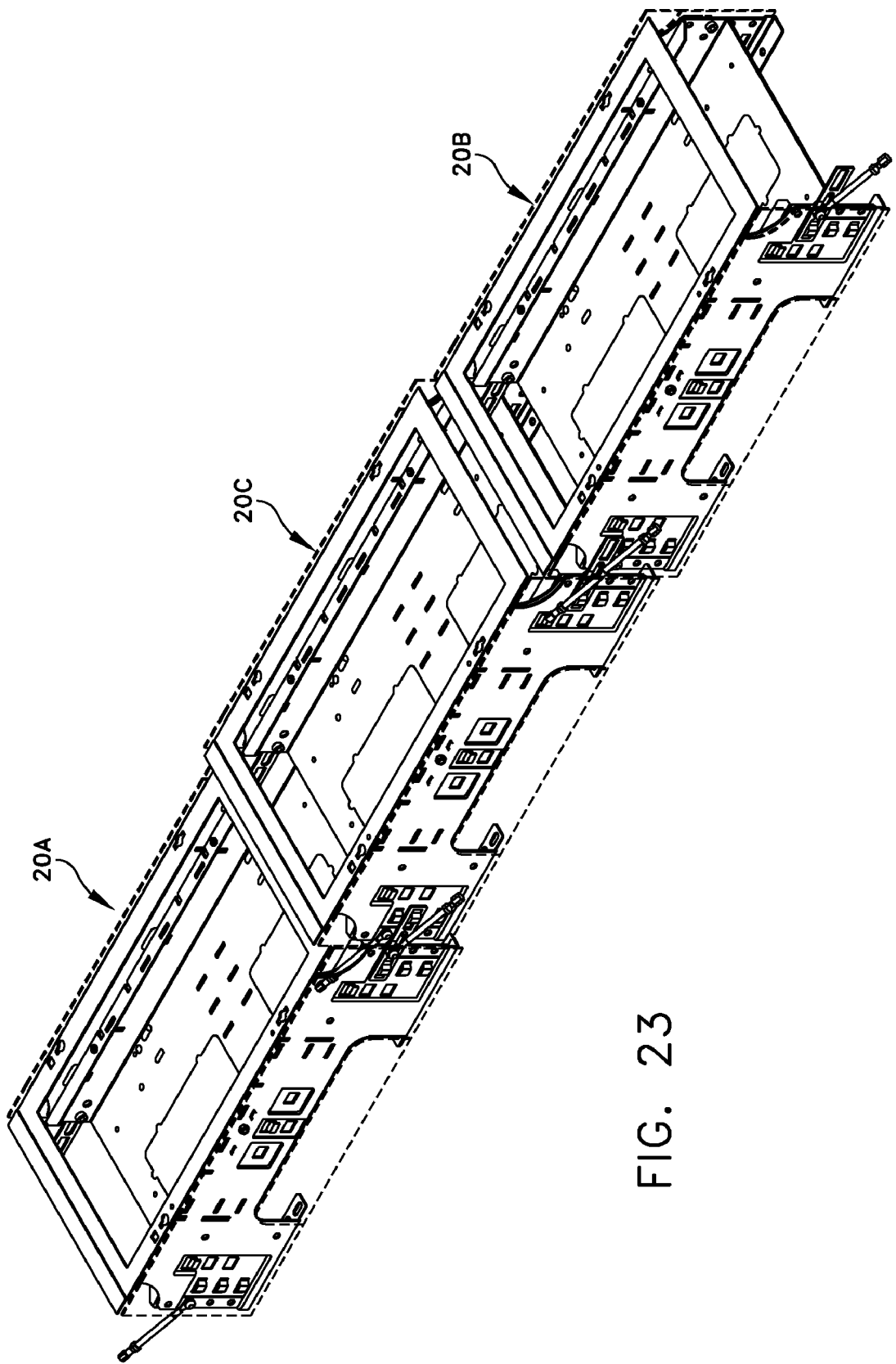
FIG. 23 is a perspective view of several cable trough assemblies shown in a through bridge configuration suitable for in-row rack removal and cooling.
Figure 24:
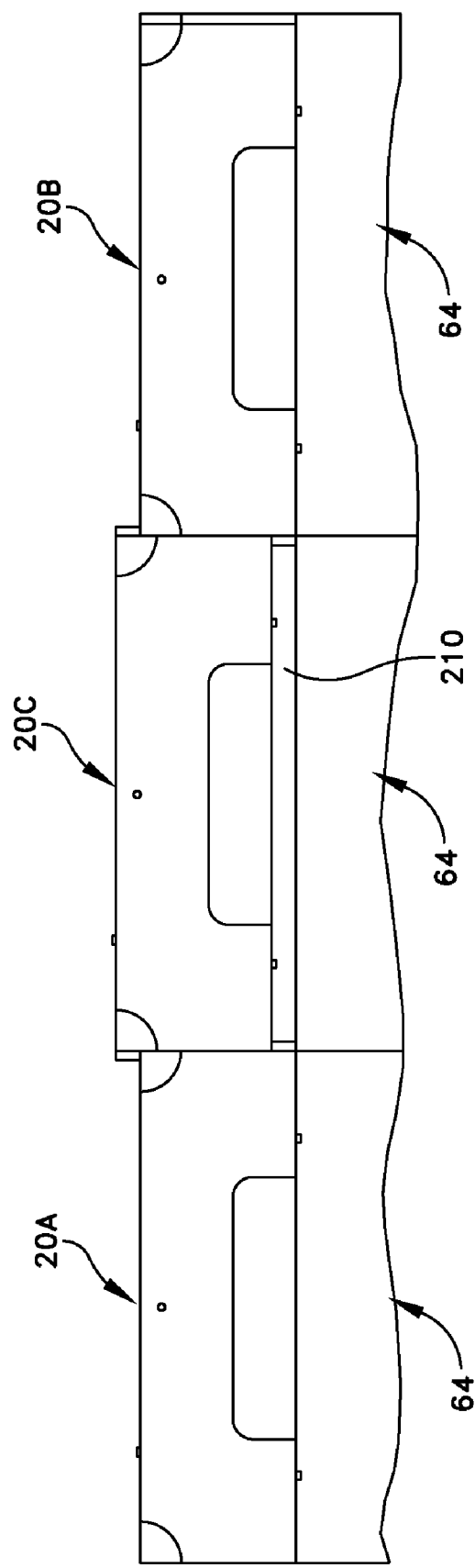
FIG. 24 is a side elevational view of the configuration shown in FIG. 23.
Figure 25:
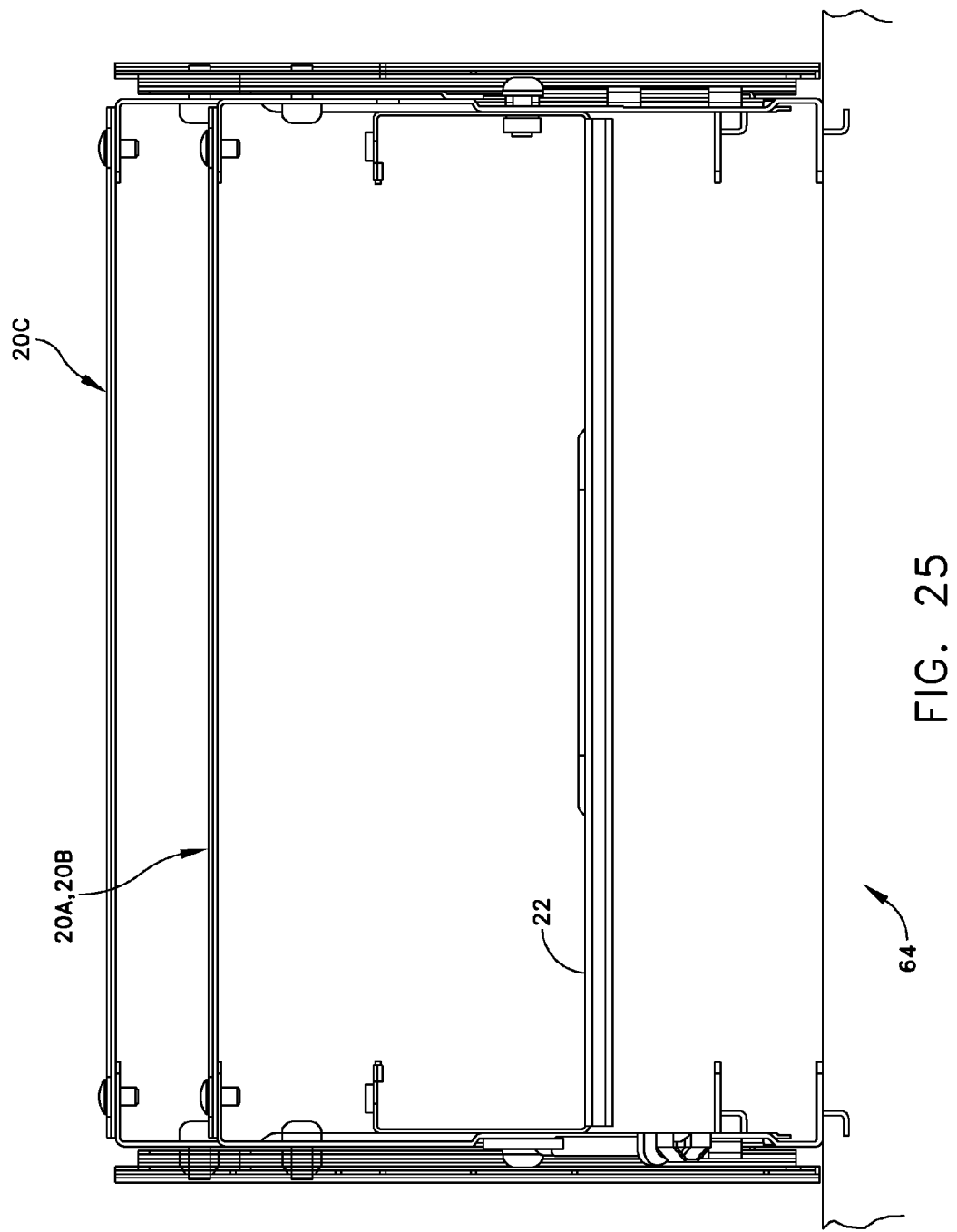
FIG. 25 is an end view of the configuration shown in FIG. 23.

Turning to FIGS. 23-25, a through bridge cable trough configuration is illustrated. As shown, two cable trough assemblies 20A, 20B are secured to respective equipment racks 64. A third cable trough assembly 20C is disposed in between the two cable trough assemblies 20A, 20B for in-row rack removal or for accommodating a cooling rack. In one embodiment, the through bridge cable trough assembly 20C is configured to be disposed between and secured to the first and second cable trough assemblies 20A, 20B in a position in which the bridge cable trough assembly 20C extends over an equipment rack or a cooling rack. As shown, the two cable trough assemblies 20A, 20B and the through bridge cable trough assembly 20C are constructed identically as the cable trough assembly 20 shown in FIG. 9.

The through bridge construction is achieved by securing the through bridge cable trough assembly 20C directly to the two cable trough assemblies 20A, 20B. Interconnecting members, such as interconnecting members 78, may be used to secure the through bridge cable trough assembly 20C in a position in which is slightly elevated with respect to the two cable trough assemblies 20A, 20B. In one particular embodiment, four interconnecting members (not shown in FIGS. 23 and 24) are secured to the lowermost openings of the first and second side walls of the through bridge cable trough assembly 20C. The free ends of the interconnecting members are secured the second lowermost openings, for example, of the respective first and second side walls of the two cable trough assemblies 20A, 20B. Screw fasteners, such fasteners 46, may be used to secure the interconnecting members to the through bridge cable trough assembly 20C and the two cable trough assemblies 20A, 20B. This arrangement raises the through bridge cable trough assembly 20C so that it spans over the equipment rack or the cooling rack disposed below it. FIG. 24 illustrates the open space 210 between the through bridge cable trough assembly 20C and the equipment rack 64 over which it spans.

It should be understood that the through bridge cable trough assembly 20C may be configured to span a cooling rack, such as cooling rack 192, for example. In this embodiment, the length of the through bridge cable trough assembly 20C would be shorter than the length of the through bridge cable trough assembly shown in FIGS. 23-25. In one example, the through bridge cable trough assembly 20C may embody cable trough assembly 190. In addition, the open space 210 between the through bridge cable trough assembly 20C and the equipment rack 64 may be increased by securing the through bridge cable trough assembly 20C to the two cable trough assemblies 20A, 20B at openings above the openings used to secure the interconnecting members.

As shown in FIG. 25, the cable trays 22 of the two cable trough assemblies 20A, 20B and the cable tray 22 of the through bridge cable trough assembly 20C are disposed along the same horizontal plane. This arrangement may be created, for example, by securing the cable trays 22 of the two cable trough assemblies 20A, 20B to the lowermost openings of the first and second side walls of the two cable trough assemblies and by securing the cable tray 22 of the through bridge cable trough assembly 20C to the second lowermost openings of the first and second side walls of the through bridge cable trough assembly. The adjustability of the cable trays 22 with respect to their respective first and second walls enables the cable trays to be positioned at a desired elevation.

Figure 26:
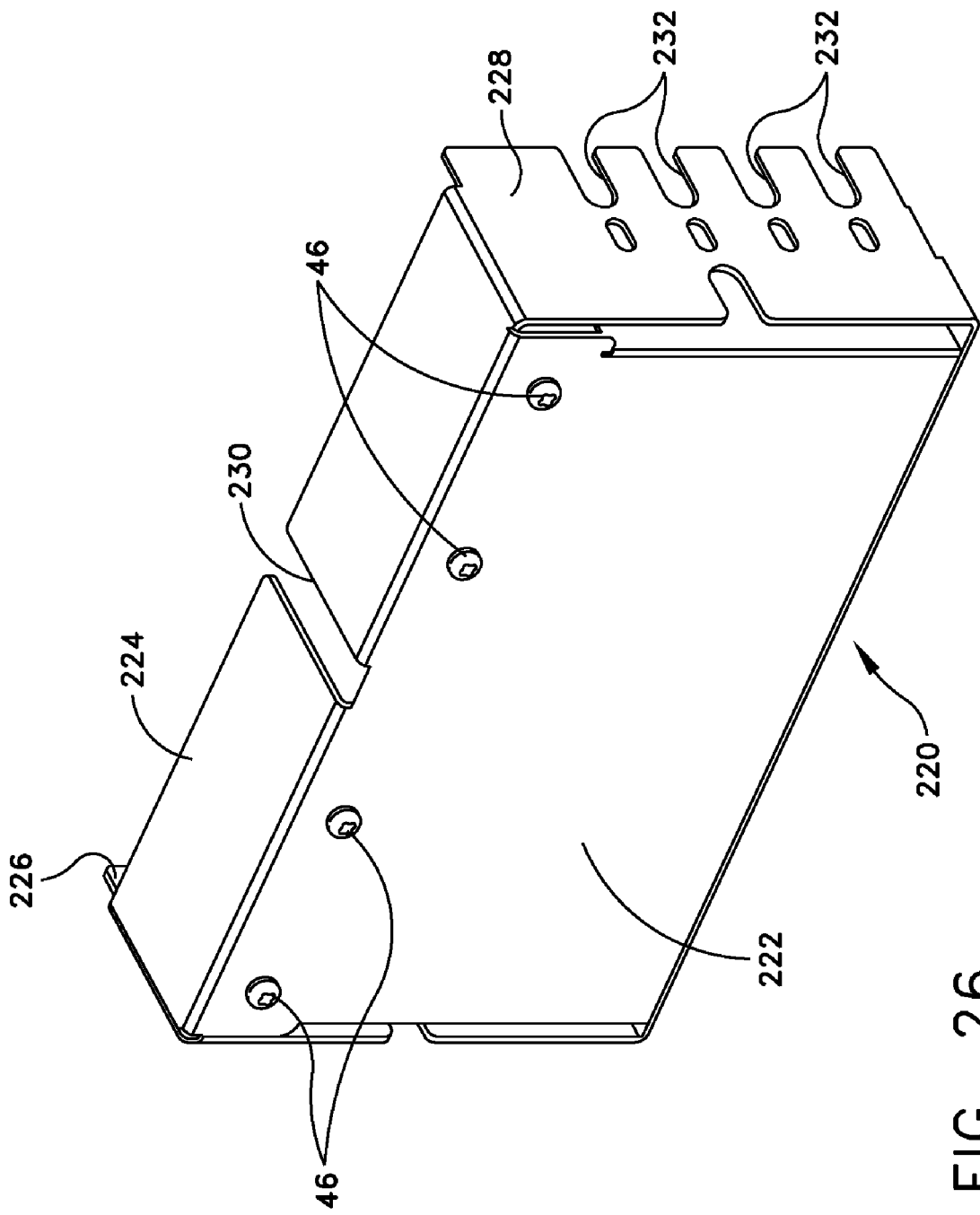
FIG. 26 is a perspective view of an end cover of an embodiment of the disclosure.
Figure 27:
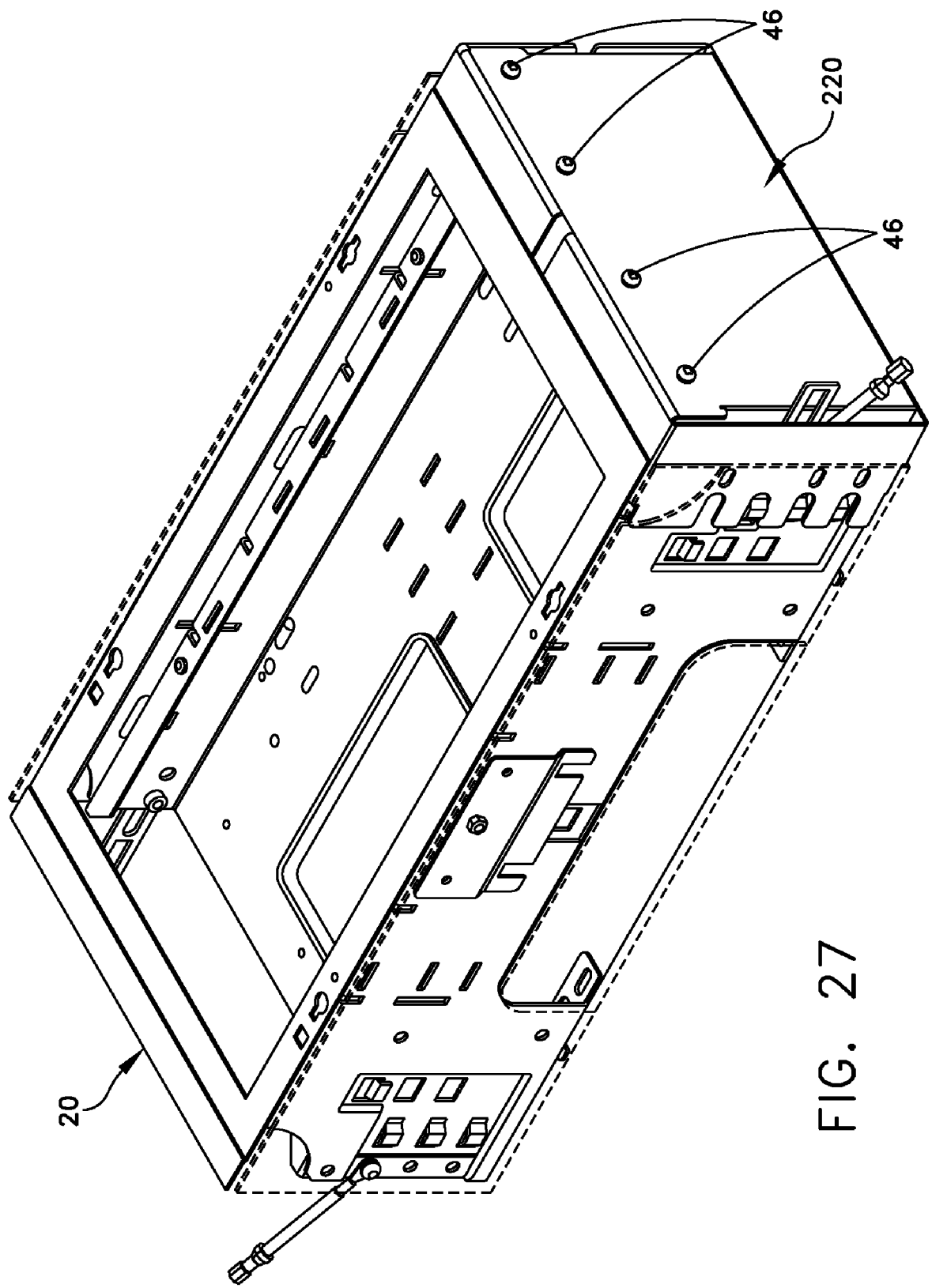
FIG. 27 is a perspective view of an end section cable trough assembly.

FIGS. 26 and 27 illustrate an end cover generally indicated at 220 configured to cover an end of a cable trough assembly, such as cable trough assembly 20 shown in FIG. 27. As shown in FIG. 26, the end cover 220 includes wall 222, a top flange portion 224 extending from an upper edge of the wall, and two side flange portions 226, 228 extending from sides of the wall. The top flange portion 224 and the side flange portions 226, 228 are configured to extend over the top and the sides of the cable trough assembly 220. The arrangement is such that the end cover 220 slips over an end of the cable trough assembly 20. Four fasteners, such as fasteners 46, are provided to secure the end cover 220 to the cable trough assembly 20. The top flange portion 224 of the end cover 220 includes a slot 230 configured to enable a cable or other device to extend through the end cover. The side flange portions 226, 228 include slots, each indicated at 232, configured to receive the fasteners, such as fasteners 46, used to secure the first and second side walls to the tray of the cable trough assembly 20.

Figure 28:
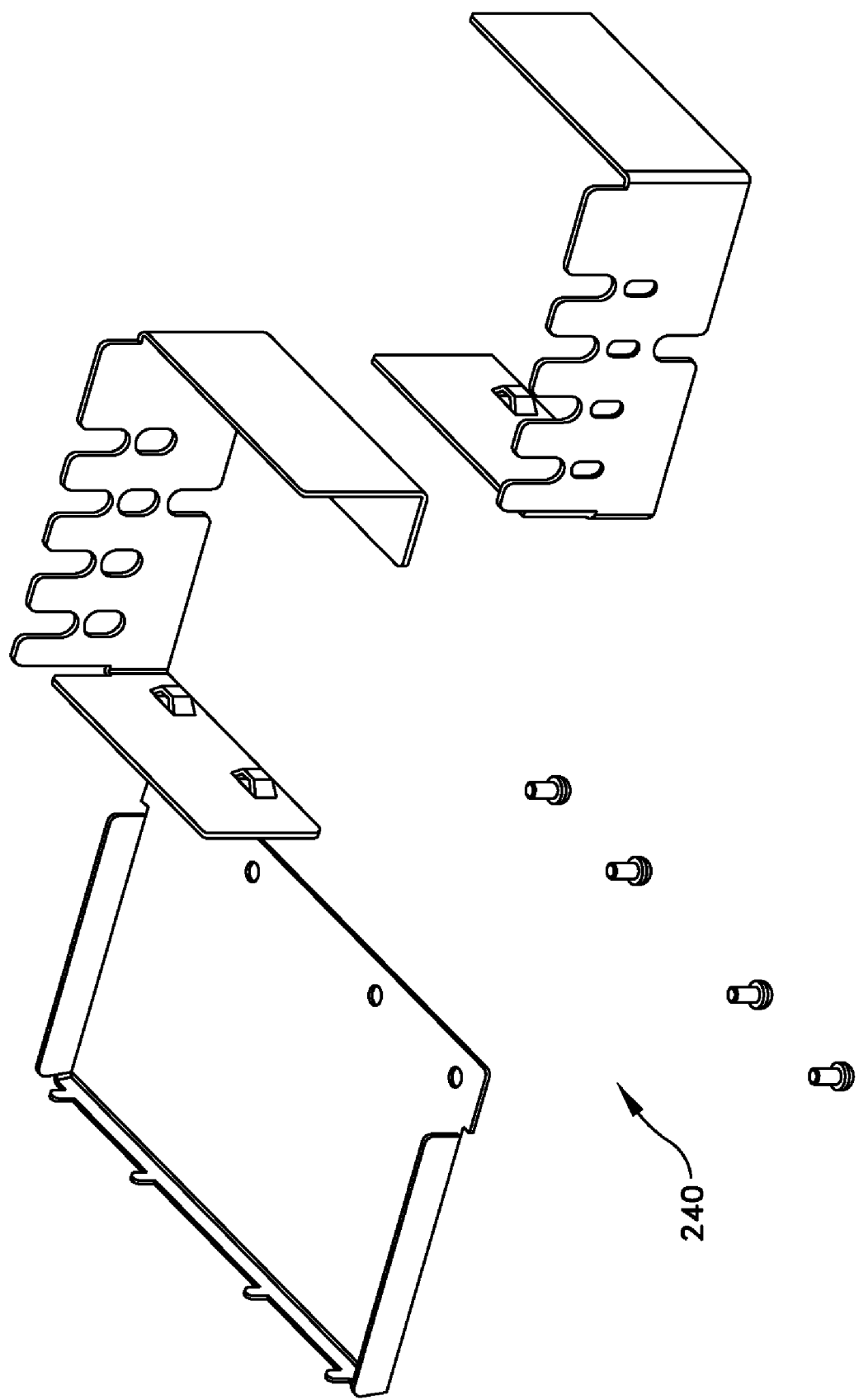
FIG. 28 is a perspective view of interconnect members of an embodiment of the disclosure.
Figure 29:
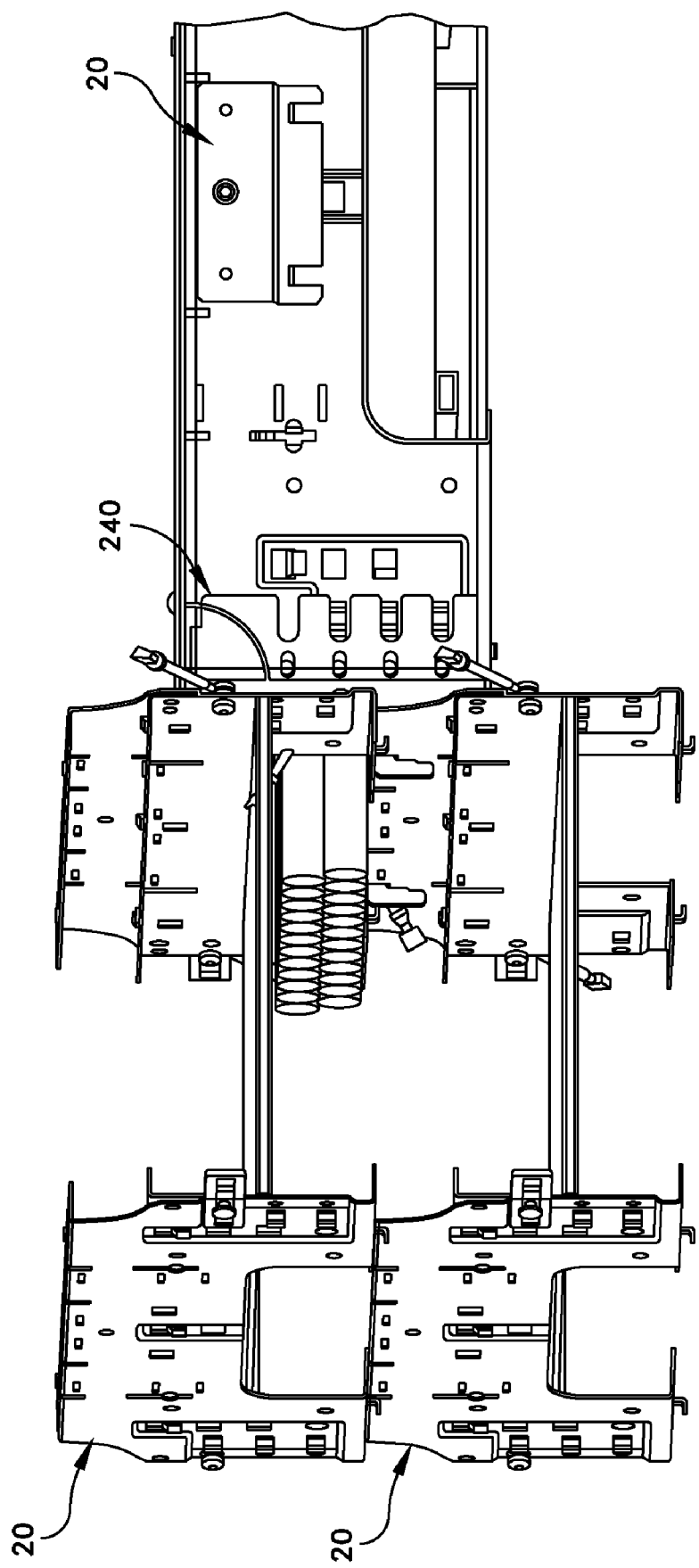
FIGS. 29 and 30 are views showing use of interconnect members with cable trough assemblies of an embodiment of the disclosure.
Figure 30:
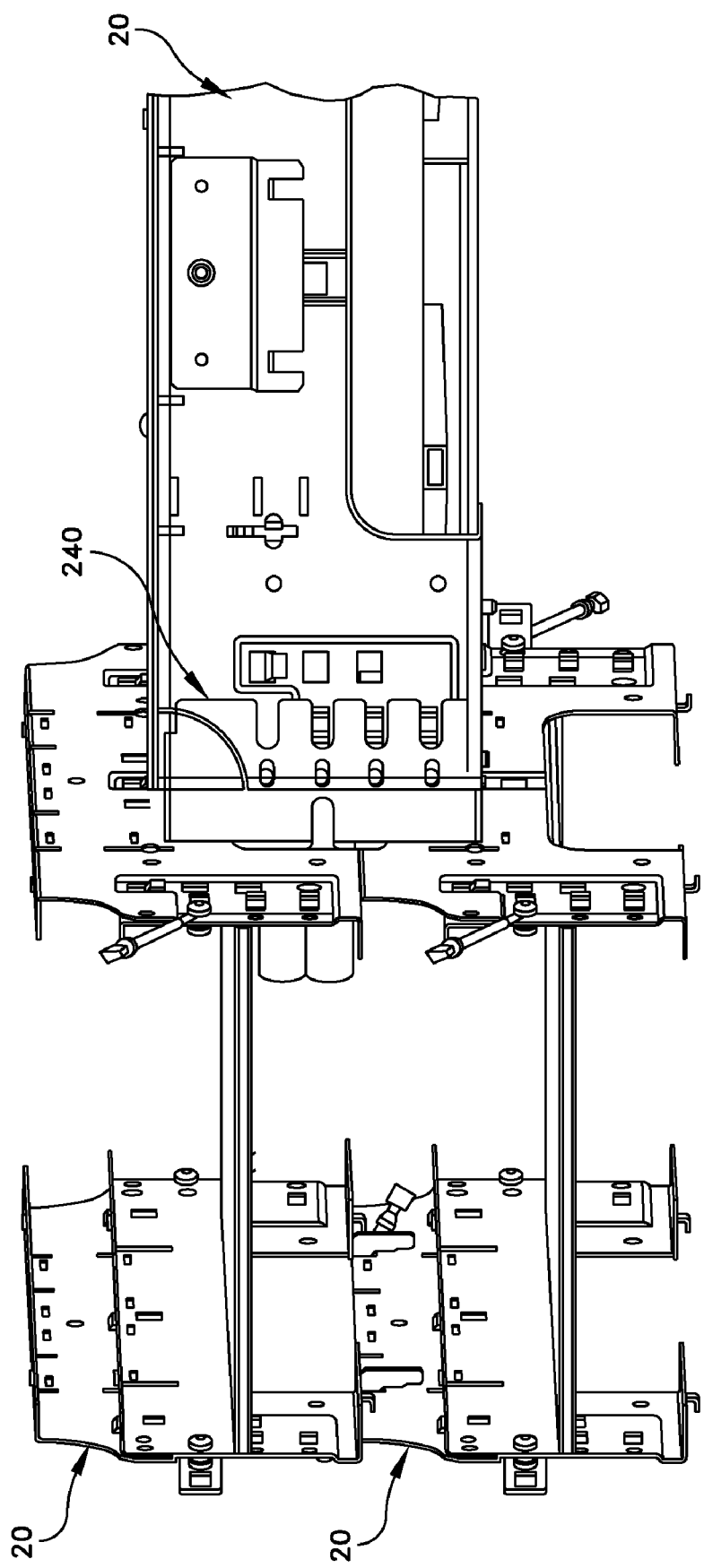

FIG. 28 illustrates an assembly of interconnect members generally indicated at 240 of used to secure a cable trough assembly, such as cable trough assembly 20, to another cable trough assembly. FIGS. 29 and 30 illustrate exemplary uses of the assembly of interconnect members 240 to secure a cable trough assembly 20 to another cable trough assembly 20.

Figure 31:
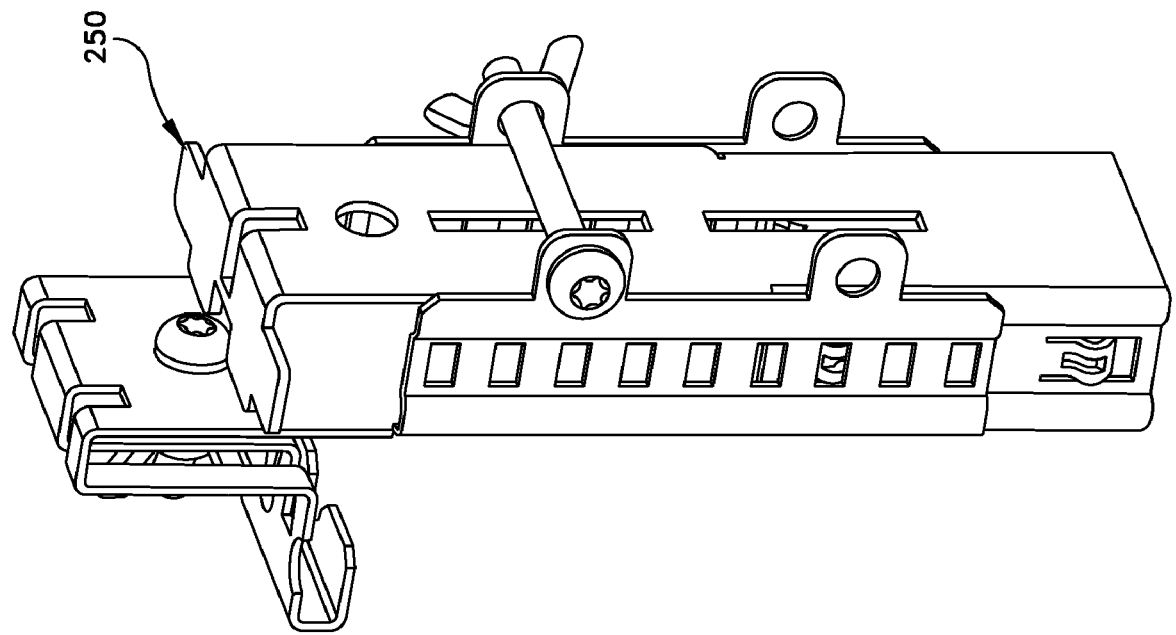
FIG. 31 is a perspective view of a ladder hanger of an embodiment of the disclosure.
Figure 32:
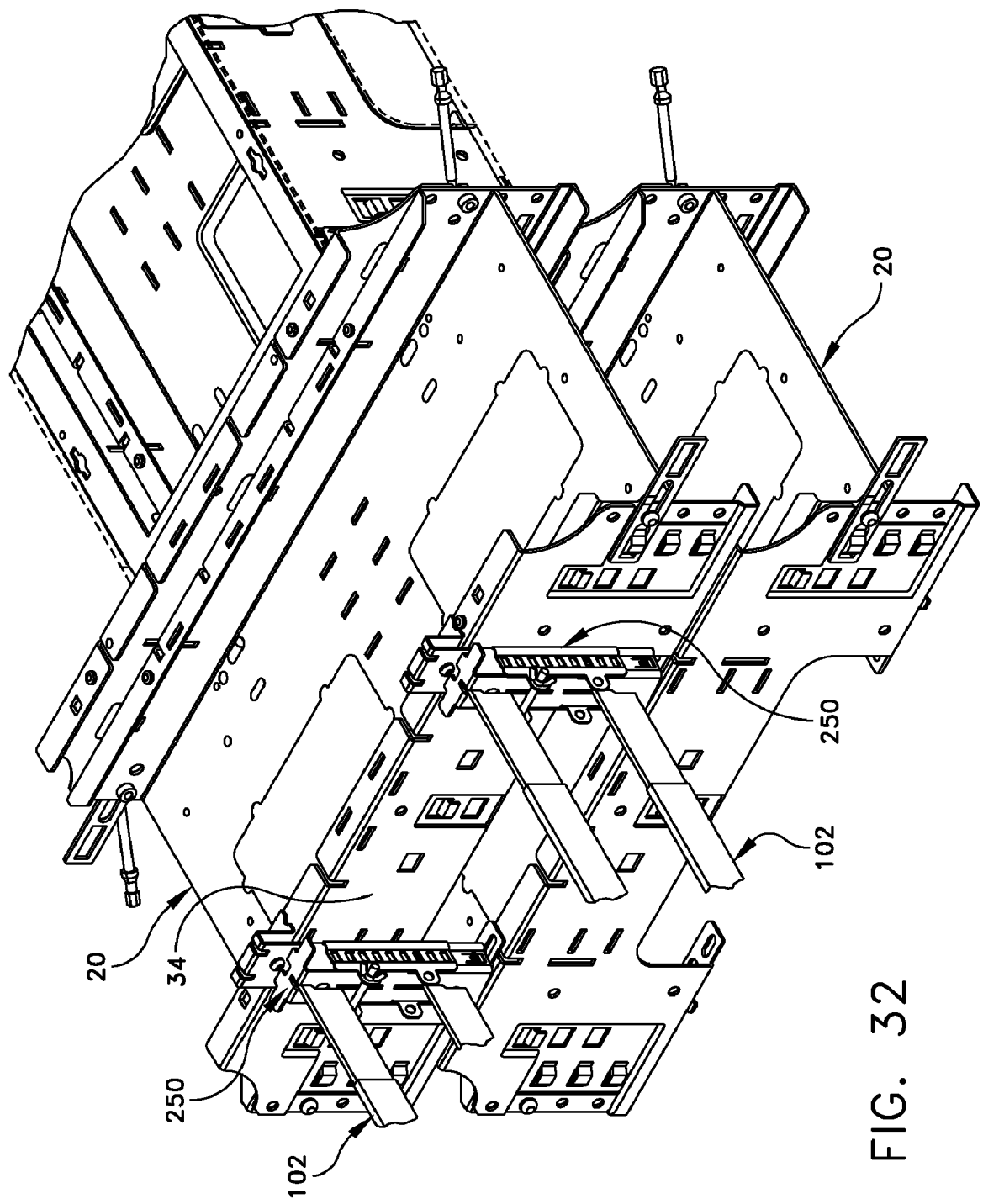
FIGS. 32 and 33 are perspective views showing use of the ladder hanger shown in FIG. 31 with cable trough assemblies.
Figure 33:
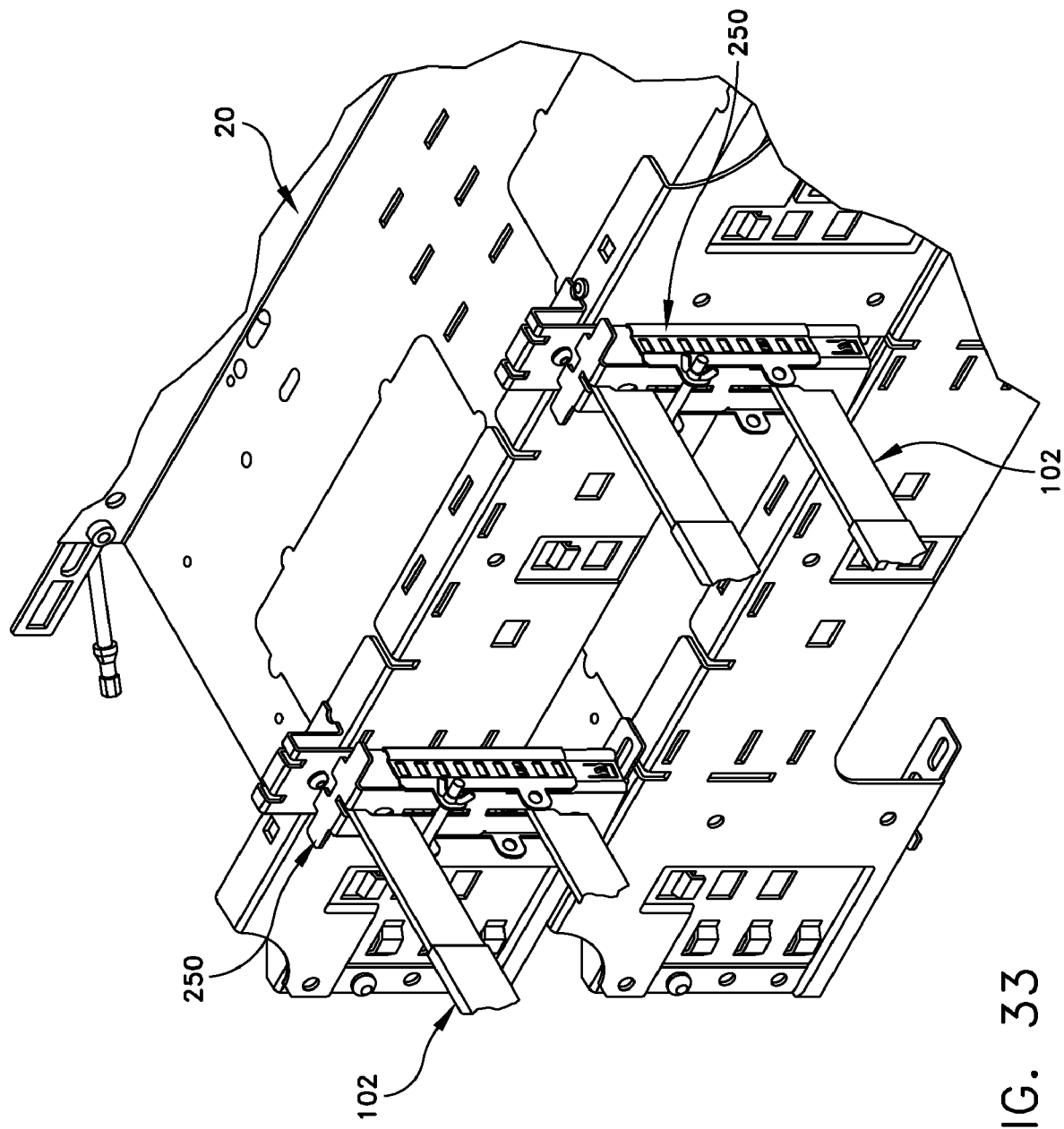

FIG. 31 illustrates a ladder hanger assembly generally indicated at 250 to vary an elevation of a cable trough assembly, such as cable trough assembly 20, with respect to another cable trough assembly on which it is mounted. FIGS. 32 and 33 illustrate exemplary uses of the ladder hanger assembly 250 to secure a cable trough assembly 20 to an insert 102. As shown, the upper cable tray assembly 20 of two stacked cable trough assemblies 20 has two ladder hanger assemblies 250 secured to the side wall 34 of the upper cable trough assembly. Each ladder hanger assembly 250 is configured to secure an end of the insert 102 so that the insert 102 extends in a direction transverse to the direction of the stacked cable trough assemblies. The provision of the ladder hanger assemblies 250 enable cables to be run in a direction perpendicular to the direction of cables run through the two cable trough assemblies 20.

Figure 34:
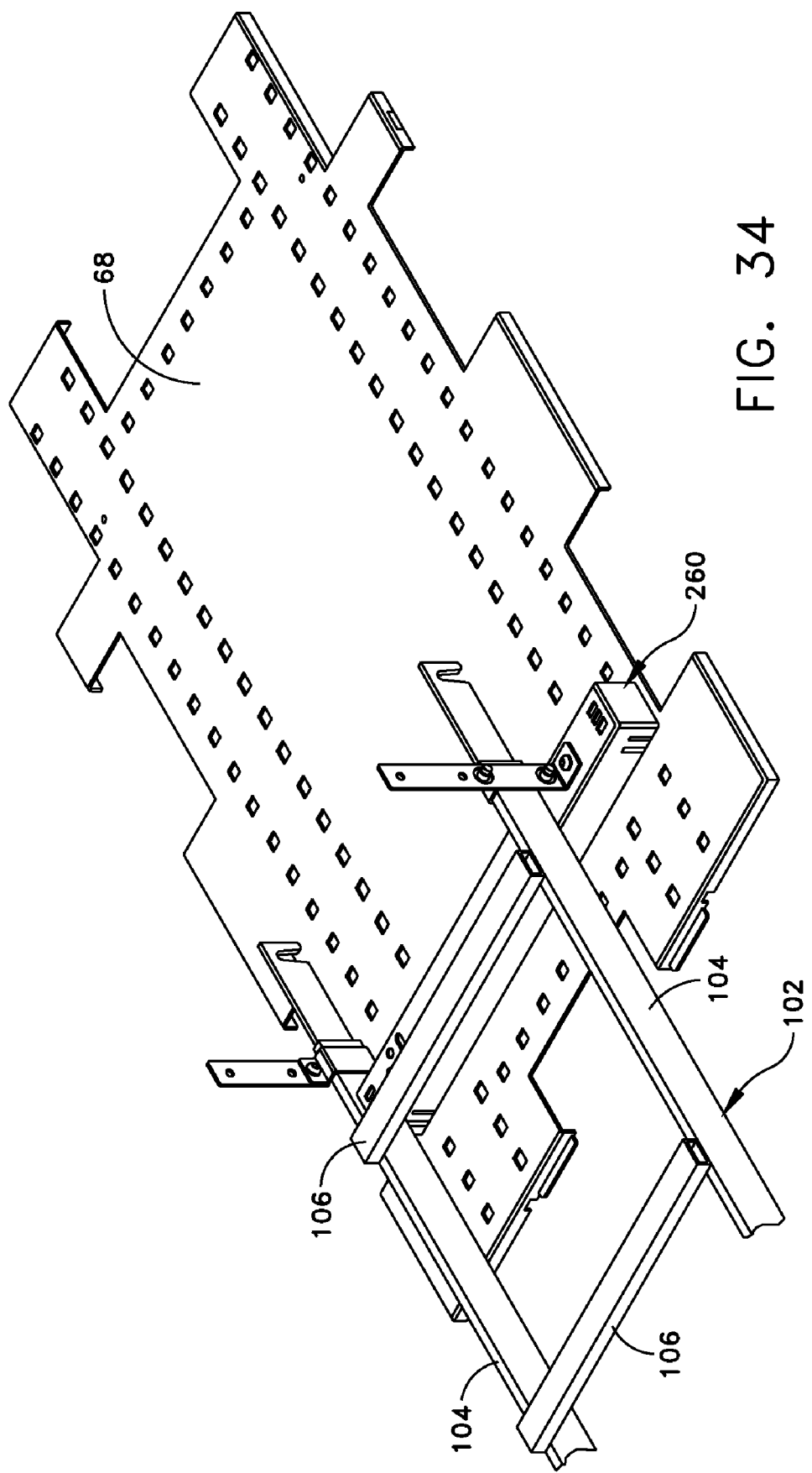
FIGS. 34-36 are perspective views showing ladder elevation brackets and their related use on equipment racks.
Figure 35:
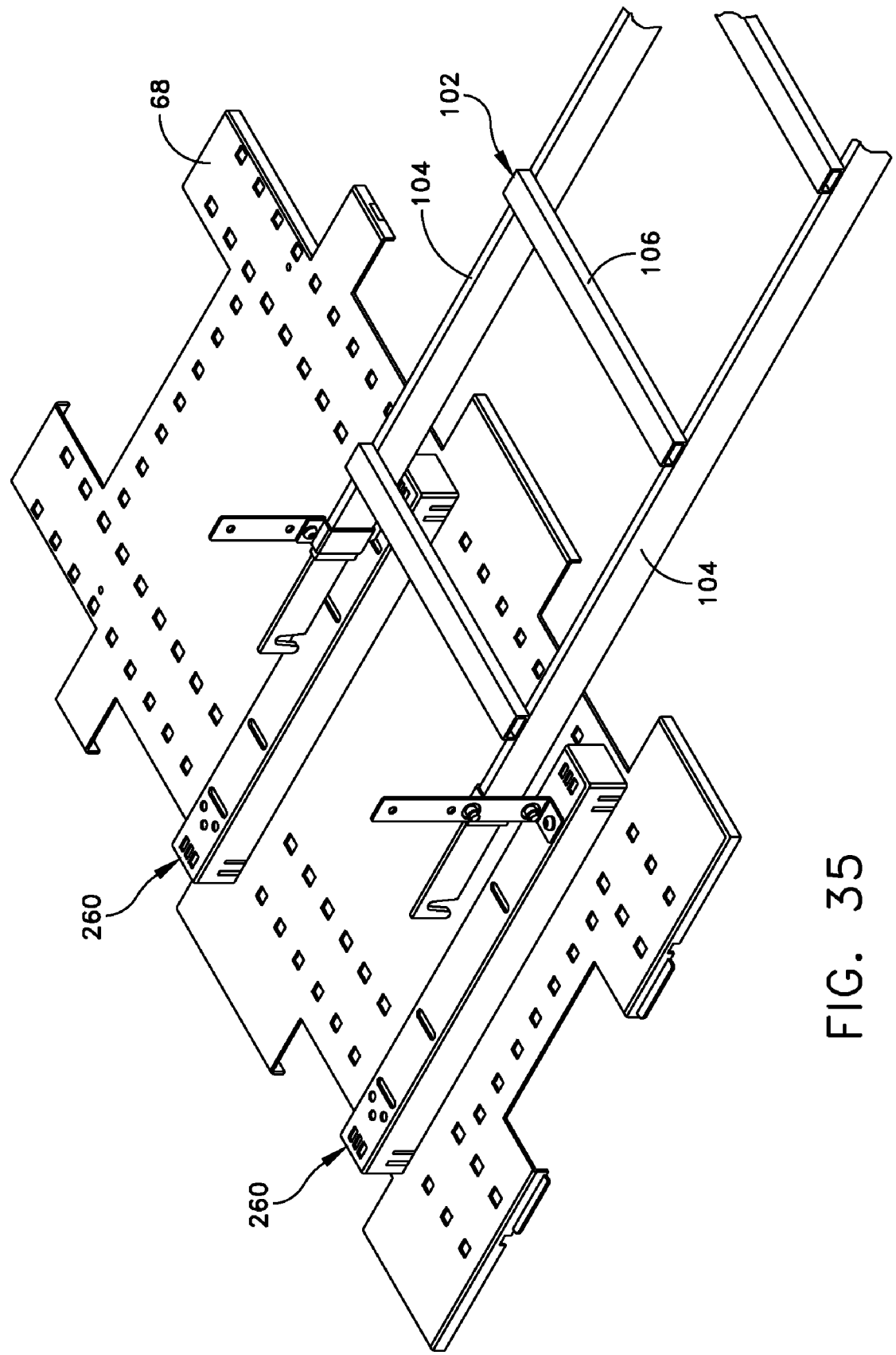
Figure 36:
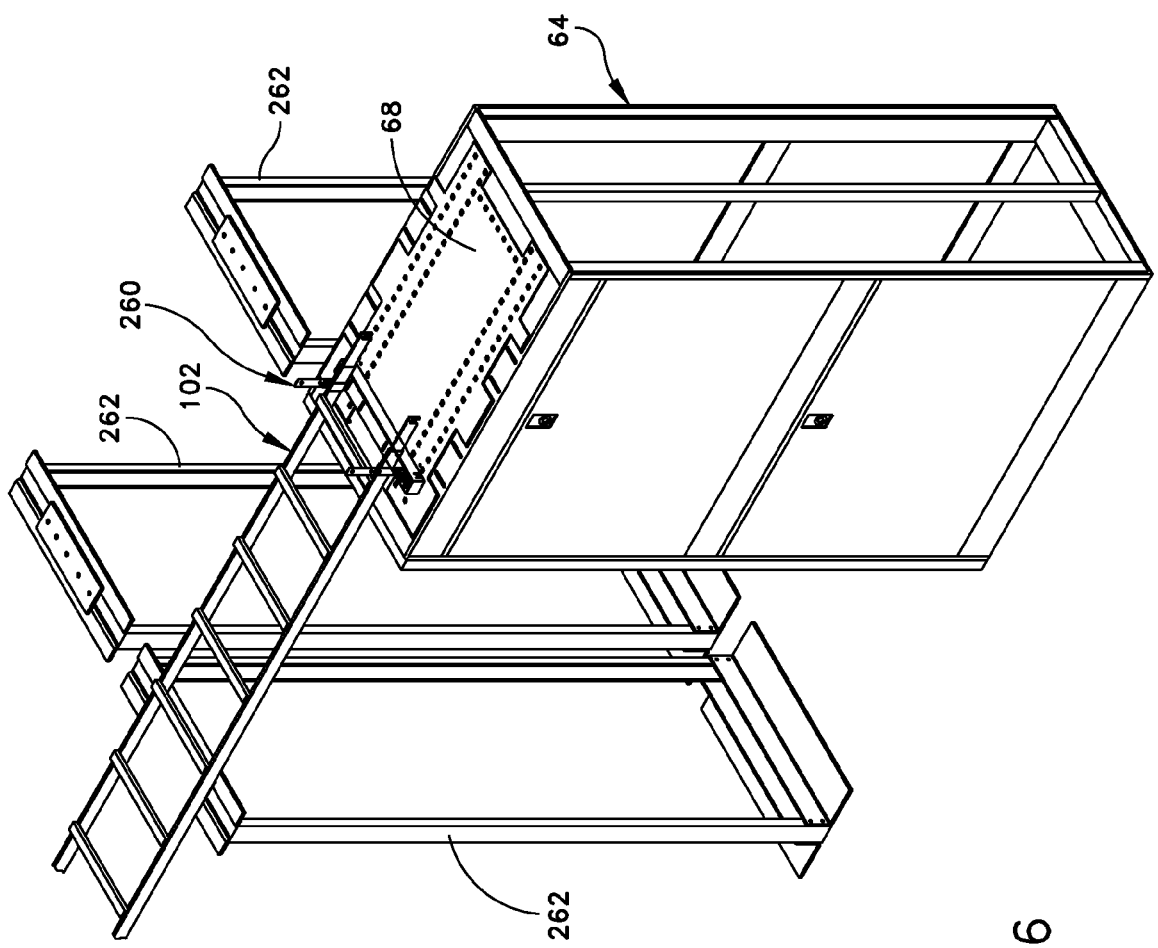

FIGS. 34-36 illustrate ladder elevation brackets, each generally indicated at 260, of embodiments of the disclosure and exemplary uses of the ladder elevation brackets on cable trough assemblies. For example, FIG. 34 illustrates a single ladder elevation bracket 260 secured to the cover 68 of an equipment rack. The ladder elevation bracket 260 is configured to secure an end of an insert 102 so that the insert is elevated with respect to the ladder elevation bracket. The longitudinal members 104 of the insert 102 extend in a direction perpendicular to the direction ladder elevation bracket 260. The configuration shown in FIG. 34 enables cables to be run along the front-to-back direction of the equipment rack.

In another example, FIG. 35 illustrates two ladder elevation brackets 260 secured to the cover 68 of an equipment rack. The arrangement is such that the longitudinal members of the insert 102 extend in a direction parallel to the direction of the ladder elevation brackets 260. As shown, the free end of each longitudinal member 104 rests upon the ladder elevation brackets 260. The configuration shown in FIG. 35 enables cables to be run along the side-to-side direction of the equipment rack.

FIG. 36 illustrates the ladder elevation bracket 260 supporting an insert 102 from an equipment rack. This configuration is similar to the configuration shown in FIG. 34. As shown in FIG. 36, one of two supports 262 is used to support the insert 102.

It should be observed that cable trough assemblies of embodiments of the disclosure essentially double the capacity of cable management than existing cable troughs. The cable trough assemblies have the same height as prior art cable troughs and may be installed on the same footprint as prior art cable troughs. In addition, the cable trough assemblies of embodiments of the disclosure enable vertical adjustment of the cable tray or the insert with respect to the side walls.

The bridge cable trough configuration may add additional length, e.g., 1.2 inches. Further, the bridge cable trough configuration enables in-row equipment rack or cooling rack removal without affecting the cable management of cables extending over the removed rack. In embodiments of the disclosure, the bridge configuration includes a 1.2 inch offset in which the horizontal cable support surface defined by the tray remains in the same plane as the trays provided on adjacent cable troughs.

In certain embodiments, the cable trough assemblies enable two-tier stacking capability. For tighter overhead space, the high middle section (2.65 inches high) may be detached from the trough assembly and be attached directly to the equipment rack or cooling rack roof. In other embodiments, the span of the cable trough assembly may be increased by incorporating a wider insert.

The cable trough assemblies of embodiments of the disclosure enable tool-less installation and the same footprint and mounting retention hook configuration as existing cable troughs. The cable trough assemblies including the insert are especially suited for power products having 300 mm, 600 mm and 750 mm widths. Thus, cable trough assemblies of embodiments of the disclosure may be mounted the same way as existing cable troughs. Moreover, the cable trough assemblies disclosed herein are particularly suited for supporting any type of cable.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. A cable trough comprising:
   a tray including a tray portion extending along a generally horizontal plane and having two opposite side edges, a first side wall portion extending along one side edge of the tray portion on a plane generally perpendicular to the plane of the tray portion, the first side wall portion having at least two vertically aligned openings formed therein at one end of the first side wall portion and at least two vertically aligned openings formed therein at an opposite end of the first side wall portion, and a second side wall portion extending along the other side edge of the tray portion on a plane generally perpendicular to the plane of the tray portion, the second side wall portion having two vertically aligned openings formed therein at one end of the second side wall portion and at least two vertically aligned openings formed therein at an opposite end of the first side wall portion;
   a first side wall including a plurality of vertically aligned openings formed therein at one end of the first side wall and a plurality of vertically aligned openings formed therein at an opposite end of the first side wall, the first side wall being configured to be secured to the first side wall portion of the tray with at least two fasteners at a selected elevation along a height of the first side wall; and
   a second side wall including a plurality of vertically aligned openings formed therein at one end of the second side wall and a plurality of vertically aligned openings formed therein at an opposite end of the second side wall, the second side wall being configured to be secured to the second side wall portion of the tray with at least two fasteners at a selected elevation along a height of the second side wall.

2. The cable trough of claim 1, further comprising an interconnecting member configured to secure a first cable trough to a second cable trough.

3. The cable trough of claim 1, wherein the first and second side walls have upper and lower edges configured to enable a first cable trough to be stacked on top of a second cable trough.

4. The cable trough of claim 1, wherein upper corners of the side walls have removed or removable portions formed therein.

5. The cable trough of claim 1, wherein the tray portion and the first and second side walls have removable portions.

6. The cable trough of claim 1, further comprising a top cover configured to enclose an open top of the tray.

7. The cable trough of claim 6, further comprising at least one side cover configured to enclose a side of at least one of the first and second side walls.

8. The cable trough of claim 1, further comprising an insert configured to replace the tray to achieve an open bottom configuration of the cable trough.

9. The cable trough of claim 8, wherein the insert includes at least one longitudinal member and at least one cross member.

10. The cable trough of claim 8, further comprises a third side wall to create a longitudinal channel within the cable trough.

11. A method of assembling a cable trough, the method comprising:
   providing a tray including a tray portion extending along a generally horizontal plane and having two opposite side edges, a first side wall portion extending along one side edge of the tray portion on a plane generally perpendicular to the plane of the tray portion, the first side wall portion having at least two vertically aligned openings formed therein at one end of the first side wall portion and at least two vertically aligned openings formed therein at an opposite end of the first side wall portion, and a second side wall portion extending along the other side edge of the tray portion on a plane generally perpendicular to the plane of the tray portion, the second side wall portion having two vertically aligned openings formed therein at one end of the second side wall portion and at least two vertically aligned openings formed therein at an opposite end of the first side wall portion;

securing a first side wall to the first side wall portion of the tray, the first side wall including a plurality of vertically aligned openings formed therein at one end of the first side wall and a plurality of vertically aligned openings formed therein at an opposite end of the first side wall, the first side wall being configured to be secured to the first side wall portion of the tray with at least two fasteners at a desire selected elevation along a height of the first side wall; and securing a second side to the second side wall portion of the tray, the second side wall including a plurality of vertically aligned openings formed therein at one end of the second side wall and a plurality of vertically aligned openings formed therein at an opposite end of the second side wall, the second side wall being configured to be secured to the second side wall portion of the tray with at least two fasteners at a selected elevation along a height of the second side wall.

12. The method of claim 11, further comprising securing the assembled cable trough to a second cable trough.

13. The method of claim 12, wherein securing the assembled cable trough to a second cable trough comprises stacking the assembled cable trough on top of the second cable trough.

14. The method of claim 12, wherein securing the assembled cable trough to a second cable trough comprises positioning the assembled cable trough next to the second cable trough so that the tray of the assembled cable trough is disposed at the same elevation as the tray of the second cable trough.

15. The method of claim 11, further comprising securing a cover to at least one of a side or top of the assembled cable trough.

16. The method of claim 11, further comprising replacing the tray with an insert configured to achieve an open bottom configuration of the cable trough.

\* \* \* \* \*

UNITED STATES PATENT AND TRADEMARK OFFICE
CERTIFICATE OF CORRECTION

PATENT NO. : 8,193,448 B2
APPLICATION NO. : 12/608240
DATED : June 5, 2012
INVENTOR(S) : Farrukh Shahzad Syed Page 1 of 1

It is certified that error appears in the above-identified patent and that said Letters Patent is hereby corrected as shown below:

In the Claims:

Column 18, Claim 1, Line 18, before the word "side", replace "first" with --second--.

Column 19, Claim 11, Line 11, before the word "side", replace "first" with --second--.

Signed and Sealed this
Second Day of July, 2013

Teresa Stanek Rea
*Acting Director of the United States Patent and Trademark Office*